United States Patent
Vida et al.

(10) Patent No.: US 11,894,621 B2
(45) Date of Patent: *Feb. 6, 2024

(54) RADIO-FREQUENCY APPARATUS WITH MULTI-BAND BALUN WITH IMPROVED PERFORMANCE AND ASSOCIATED METHODS

(71) Applicant: Silicon Laboratories Inc., Austin, TX (US)

(72) Inventors: Zoltan Vida, Budapest (HU); Attila L. Zolomy, Budapest (HU)

(73) Assignee: Silicon Laboratories Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/845,369

(22) Filed: Dec. 18, 2017

(65) Prior Publication Data

US 2019/0190149 A1   Jun. 20, 2019

(51) Int. Cl.

| H03H 7/42  | (2006.01) |
|---|---|
| H01P 5/10  | (2006.01) |
| H01Q 5/307 | (2015.01) |
| H01Q 15/00 | (2006.01) |
| H01Q 5/50  | (2015.01) |
| H01Q 5/28  | (2015.01) |
| H03H 9/00  | (2006.01) |
| H03H 7/38  | (2006.01) |

(52) U.S. Cl.
CPC ............. *H01Q 5/307* (2015.01); *H01Q 5/28* (2015.01); *H01Q 5/50* (2015.01); *H01Q 15/006* (2013.01); *H03H 7/42* (2013.01); *H03D 2200/0023* (2013.01); *H03H 9/0004* (2013.01); *H03H 2007/386* (2013.01)

(58) Field of Classification Search
CPC .......... H03H 7/42; H03H 7/422; H03H 7/425; H03H 7/46; H01P 1/10; H01P 5/10
USPC ............................................. 333/25, 26, 101
See application file for complete search history.

(56) References Cited

U.S. PATENT DOCUMENTS

| 4,328,501 A | 5/1982 | DeSantis |
|---|---|---|
| 4,799,066 A | 1/1989 | Deacon |
| 5,631,611 A | 5/1997 | Luu |
| 5,874,926 A | 2/1999 | Tsuru |
| 5,889,445 A | 3/1999 | Ritter |

(Continued)

FOREIGN PATENT DOCUMENTS

| CN | 106505962 A | 3/2017 |
|---|---|---|
| EP | 2214306 A1 | 8/2010 |
| KR | 20150072119 A | 6/2015 |

OTHER PUBLICATIONS

Web page, "3.1 Multi-band Sub-1GHz tunable RF sub-system for smart meters" (Apr. 27, 2017, 2 pgs.), available at https://training.ti.com/multi-band-sub-1 ghz-tunable-rf-sub-system-smart-meters.

(Continued)

*Primary Examiner* — Andrea Lindgren Baltzell
*Assistant Examiner* — Kimberly E Glenn
(74) *Attorney, Agent, or Firm* — Law Offices of Maximilian R. Peterson

(57) ABSTRACT

An apparatus includes an RF apparatus, and a multi-band matching balun coupled to the RF apparatus. The multi-band matching balun includes at least one three-element frequency-dependent resonator (TEFDR) and at most three reactive elements.

20 Claims, 19 Drawing Sheets

(56) References Cited

U.S. PATENT DOCUMENTS

| | | | |
|---|---|---|---|
| 5,949,299 A * | 9/1999 | Harada | H03H 7/42 333/185 |
| 5,995,814 A | 11/1999 | Yeh | |
| 6,009,318 A * | 12/1999 | Freed | H03H 7/42 455/326 |
| 6,329,886 B1 | 12/2001 | Ogoro | |
| 6,603,430 B1 | 8/2003 | Hill | |
| 6,862,441 B2 | 3/2005 | Ella | |
| 6,980,776 B2 * | 12/2005 | Shimada | H04B 1/40 333/100 |
| 6,990,357 B2 | 1/2006 | Ella | |
| 7,034,630 B2 * | 4/2006 | Rijks | H03H 7/422 333/246 |
| 7,058,372 B1 | 6/2006 | Pardoen | |
| 7,088,307 B2 | 8/2006 | Imaizumi | |
| 7,116,185 B2 * | 10/2006 | Ohi | H03H 7/42 333/25 |
| 7,155,252 B2 | 12/2006 | Martin | |
| 7,193,477 B2 | 3/2007 | Chang et al. | |
| 7,199,684 B2 | 4/2007 | Aigner | |
| 7,248,844 B2 * | 7/2007 | Rofougaran | H01L 27/0251 455/117 |
| 7,323,939 B2 | 1/2008 | Han et al. | |
| 7,330,085 B2 * | 2/2008 | Ezzeddine | H03H 7/42 333/25 |
| 7,466,277 B2 | 12/2008 | Ishizuka | |
| 7,489,914 B2 | 2/2009 | Govind | |
| 7,518,469 B2 | 4/2009 | Kemmochi | |
| 7,557,757 B2 | 7/2009 | Deavours | |
| 7,586,388 B2 | 9/2009 | Harada | |
| 7,683,733 B2 * | 3/2010 | Li | H01F 19/04 333/25 |
| 7,755,435 B2 | 7/2010 | Lu et al. | |
| 7,978,024 B2 | 7/2011 | Cheng | |
| 8,068,795 B2 | 11/2011 | Bavisi | |
| 8,081,047 B2 | 12/2011 | Royak | |
| 8,138,853 B2 * | 3/2012 | Chu | H03H 7/38 333/101 |
| 8,164,387 B1 | 4/2012 | Apel | |
| 8,174,390 B2 | 5/2012 | Kim | |
| 8,229,367 B2 | 7/2012 | Chan et al. | |
| 8,306,489 B2 | 11/2012 | Schwarzmueller | |
| 8,344,952 B2 | 1/2013 | Yi | |
| 8,368,481 B2 * | 2/2013 | Jin | H03H 7/42 333/101 |
| 8,436,695 B2 | 5/2013 | Mu | |
| 8,493,126 B2 | 7/2013 | Sankaranarayanan | |
| 8,633,781 B2 * | 1/2014 | Bradley | H03H 7/38 333/187 |
| 8,842,410 B2 | 9/2014 | Chan | |
| 9,059,681 B2 * | 6/2015 | Tanaka | H03H 7/42 |
| 9,083,301 B2 * | 7/2015 | Tanaka | H03H 7/42 |
| 9,106,204 B2 * | 8/2015 | Fritz | H03F 3/26 |
| 9,306,535 B2 * | 4/2016 | Bradley | H03H 7/42 |
| 9,316,723 B2 | 4/2016 | Tayrani | |
| 9,397,720 B2 * | 7/2016 | Jerng | H04B 1/00 |
| 9,520,854 B2 | 12/2016 | Kim | |
| 9,647,706 B2 | 5/2017 | Salfelner | |
| 9,680,442 B2 | 6/2017 | Salfelner | |
| 9,917,566 B2 | 3/2018 | Salfelner | |
| 9,939,471 B1 | 4/2018 | Omoumi | |
| 9,991,597 B2 | 6/2018 | Velandia | |
| 10,071,605 B1 | 9/2018 | Liang | |
| 10,305,532 B1 * | 5/2019 | Jantzi | H03H 7/0153 |
| 10,374,300 B2 | 8/2019 | Rahikkala | |
| 2002/0118075 A1 | 8/2002 | Ohwada | |
| 2003/0128081 A1 * | 7/2003 | Ella | H03H 9/589 333/133 |
| 2003/0174093 A1 | 9/2003 | Huber | |
| 2003/0210189 A1 | 11/2003 | Jinushi | |
| 2005/0003771 A1 | 1/2005 | De Ruijter | |
| 2005/0174297 A1 | 8/2005 | Cake | |
| 2005/0208917 A1 | 9/2005 | Roufoogaran | |
| 2006/0044080 A1 | 3/2006 | Hagiwara | |
| 2006/0092079 A1 | 5/2006 | de Rochemont | |
| 2006/0103578 A1 | 5/2006 | Landaeus | |
| 2007/0001704 A1 | 1/2007 | O'Mahony | |
| 2007/0024377 A1 | 2/2007 | Wang et al. | |
| 2007/0268092 A1 * | 11/2007 | Inoue | H03H 7/42 333/133 |
| 2008/0129610 A1 | 6/2008 | Tsafati et al. | |
| 2008/0174383 A1 * | 7/2008 | Zolomy | H03H 7/38 333/32 |
| 2008/0186106 A1 | 8/2008 | Christian | |
| 2008/0278258 A1 | 11/2008 | Liu | |
| 2009/0015500 A1 | 1/2009 | Hoshiai | |
| 2009/0085689 A1 * | 4/2009 | Rohani | H03H 7/46 333/25 |
| 2009/0121959 A1 | 5/2009 | Li | |
| 2009/0130999 A1 | 5/2009 | Chen | |
| 2009/0174618 A1 | 7/2009 | Huang | |
| 2009/0251382 A1 | 10/2009 | Umehara | |
| 2009/0315792 A1 | 12/2009 | Miyashita | |
| 2009/0322617 A1 | 12/2009 | Tseng | |
| 2010/0073248 A1 | 3/2010 | Motta | |
| 2010/0109846 A1 | 5/2010 | Nagai | |
| 2010/0194494 A1 * | 8/2010 | Inoue | H03H 7/42 333/133 |
| 2010/0231451 A1 | 9/2010 | Noguchi | |
| 2010/0238079 A1 | 9/2010 | Ayatollahi | |
| 2010/0253581 A1 | 10/2010 | Tsou | |
| 2010/0265145 A1 | 10/2010 | Chung | |
| 2010/0289700 A1 | 11/2010 | Yang | |
| 2011/0223873 A1 | 9/2011 | Qiu | |
| 2011/0256841 A1 | 10/2011 | Kakuya | |
| 2012/0001821 A1 | 1/2012 | Nakano | |
| 2012/0112972 A1 | 5/2012 | Ogawa | |
| 2012/0154071 A1 * | 6/2012 | Bradley | H03H 7/38 333/133 |
| 2012/0229360 A1 | 9/2012 | Jagielski | |
| 2012/0314734 A1 | 12/2012 | Zierdt | |
| 2013/0033410 A1 | 2/2013 | Wong | |
| 2013/0214812 A1 | 8/2013 | Koo | |
| 2013/0307742 A1 * | 11/2013 | Hu | H01Q 9/265 343/852 |
| 2013/0314288 A1 * | 11/2013 | Tayrani | G01S 7/034 343/859 |
| 2013/0334215 A1 | 12/2013 | Chen | |
| 2013/0341411 A1 | 12/2013 | Kai | |
| 2014/0111381 A1 | 4/2014 | Lee | |
| 2014/0111382 A1 | 4/2014 | Lee | |
| 2014/0113679 A1 | 4/2014 | Wehrmann | |
| 2014/0125540 A1 | 5/2014 | Tetsuno | |
| 2014/0125548 A1 | 5/2014 | Jouanlanne | |
| 2014/0125552 A1 | 5/2014 | Takisawa | |
| 2014/0320351 A1 | 10/2014 | Wei | |
| 2014/0327494 A1 | 11/2014 | Sato | |
| 2014/0375507 A1 | 12/2014 | Lin | |
| 2014/0375527 A1 | 12/2014 | Rutfors | |
| 2015/0022402 A1 | 1/2015 | Gavilan | |
| 2015/0048896 A1 | 2/2015 | Kovac | |
| 2015/0311881 A1 | 10/2015 | Nagumo | |
| 2015/0349726 A1 | 12/2015 | Han et al. | |
| 2016/0156335 A1 | 6/2016 | Takeuchi | |
| 2016/0164474 A1 * | 6/2016 | Beltran Lizarraga | H03F 1/3217 375/219 |
| 2016/0268992 A1 | 9/2016 | Salfelner | |
| 2016/0336649 A1 | 11/2016 | Yu | |
| 2017/0214378 A1 | 7/2017 | Black | |
| 2017/0244442 A1 * | 8/2017 | Mizokami | H04B 1/48 |
| 2018/0062254 A1 | 3/2018 | Rahikkala | |
| 2018/0145410 A1 | 5/2018 | Ban | |
| 2018/0316082 A1 | 11/2018 | Keller | |
| 2019/0190149 A1 | 6/2019 | Vida | |
| 2019/0190482 A1 * | 6/2019 | Vida | H03H 7/422 |

OTHER PUBLICATIONS

U.S. Appl. No. 15/250,719, filed Aug. 2016, Rahikkala.
U.S. Appl. No. 16/439,458, filed Jun. 2019, Rahikkala.
U.S. Appl. No. 15/823,319, filed Nov. 2017, Zólomy.

(56) References Cited

OTHER PUBLICATIONS

U.S. Appl. No. 15/845,327, filed Dec. 2017, Vida.
U.S. Appl. No. 16/237,511, filed Dec. 2018, Zólomy.
U.S. Appl. No. 16/237,583, filed Dec. 2018, Zólomy.
U.S. Appl. No. 16/420,111, filed May 2019, Voor.
U.S. Appl. No. 16/420,116, filed Feb. 2019, Zólomy.
U.S. Appl. No. 16/719,925, filed Dec. 2019, Vida.
U.S. Appl. No. 16/724,160, filed Dec. 2019, Zólomy.
U.S. Appl. No. 17/491,195, filed Sep. 2021, Hänninen.
U.S. Appl. No. 17/491,221, filed Sep. 2021, Rahikkala.
Office communication in U.S. Appl. No. 15/845,327, 6 pgs.
Office communication in U.S. Appl. No. 16/237,511, 31 pgs.
Office communication in U.S. Appl. No. 17/705,260, 7 pgs.
Johanson Technology, *High Frequency Ceramic Solutions*, 4 pgs., 2016.
Johanson Technology, *High Frequency Ceramic Solutions*, 4 pgs., 2014.
AN91445, *Antenna Design and RF Layout Guidelines*, Cypress, 60 pgs., 2014-2016.
Amotech Co., Ltd., *Datasheet*, 8 pgs., 2009.
Office communication in U.S. Appl. No. 15/250,719, 9 pgs.
Office communication in U.S. Appl. No. 15/250,719, 8 pgs.
Office communication in U.S. Appl. No. 15/823,319, 18 pgs.
Office communication in U.S. Appl. No. 15/823,319, 29 pgs.
Office communication in U.S. Appl. No. 15/823,319, 32 pgs.
Office communication in U.S. Appl. No. 15/823,319, 16 pgs.
AN923: EFR32 sub-GHz Matching Guide, Silicon Labs, Jun. 29, 2016, 25 pgs.
D.C. Youla, A New Theory of Broad-band Matching, IEE Transactions on Circuit Theory, Mar. 1964, 21 pgs.
Károly Géher: Linear Networks, 4th edition 1979, Hungarian Technical Book Press (pp. 434-436; translated portions included).
AN643: Si446x/Si4362 RX LNA Matching, Silicon Labs, 2014, 26 pgs.
Office communication in U.S. Appl. No. 15/845,327, 12 pgs.
Office communication in U.S. Appl. No. 15/845,327, 18 pgs.
Office communication in U.S. Appl. No. 15/845,327, 15 pgs.
Office communication in U.S. Appl. No. 15/845,327, 14 pgs.
Office communication in U.S. Appl. No. 16/237,511, 10 pgs.
Office communication in U.S. Appl. No. 16/237,511, 14 pgs.
Office communication in U.S. Appl. No. 16/237,583, 10 pgs.
Office communication in U.S. Appl. No. 16/237,583, 8 pgs.
Office communication in U.S. Appl. No. 16/237,583, 9 pgs.
Office communication in U.S. Appl. No. 16/420,111, 9 pgs.
Office communication in U.S. Appl. No. 16/420,111, 10 pgs.
Office communication in U.S. Appl. No. 16/420,116, 9 pgs.
Office communication in U.S. Appl. No. 16/420,116, 7 pgs.
Office communication in U.S. Appl. No. 16/719,925, 13 pgs.
Office communication in U.S. Appl. No. 16/719,925, 19 pgs.
Office communication in U.S. Appl. No. 16/719,925, 17 pgs.
Office communication in U.S. Appl. No. 16/724,160, 8 pgs.
AN427: EZ Radio Pro™ Si433X & Si443X RX LNA Matching, Silicon Labs, 2009, 22 pgs.
Liu et al., Excitation Techniques of Loop Current Mode of Ground Antenna, 2011 Cross Strait Quad Regional Radio Science and Wireless Technology Conference, 2011, 4 pgs.
Zahid et al., Analysis of a loop type ground radiation antenna based on equivalent circuit model, IET Microwave, Antennas & Propagation Journal, 2016, 6 pgs.
Cho et al., Loop-type ground antenna using capacitor, Electronics Letters, Jan. 6, 2011, vol. 47, No. 1, 1 pg.
Zhang et al., Bandwidth enhancement of ground antenna using resonant feeding circuit, Electronics Letters, Mar. 28, 2013, vol. 49, No. 7, 2 pgs.
Qu et al., Circular Polarized Ground Radiation Antenna for Mobile Applications, IEEE Transactions on Antennas and Propagation, vol. 66, No. 5, May 2018, pp. 2655-2660.
Zahid et al., Decoupler Deign for MIMO Antennas of USB Dongle Applications Using Ground Mode Coupling Analysis, Progress in Electromagnetics Research M, vol. 76, 113-122, 2018, 10 pgs.
Liu et al., Loop-Type Ground Radiation Antenna for Dual-Band WLAN Applications, IEEE Transactions on Antennas and Propagation, vol. 61, No. 9, Sep. 2013, pp. 4819-4823.
Qu et al., Compact dual-band antenna using inverted-L loop and inner rectangular loop for WLAN applications, Electronics Letters, Nov. 5, 2015, vol. 51, No. 23, pp. 1843-1844.
Liu et al., Excitation Techniques of Loop Current Mode of Ground Antenna, 2011 Cross Strait Quad-Regional Radio Science and Wireless Technology Conference, 2011, pp. 1732-1735.
Qu et al., Performance enhancement of ground radiation antenna for Z-wave applications using tunable metal loads, Electronics Letters, Oct. 27, 2016, vol. 52, No. 22, pp. 1827-1828.
Qu et al., Ground Radiation Antenna for Mobile Devices, IEEE, 2017, 3 pgs.
Xu et al., Improvement of ground radiation antenna performance using compact EBG in presence of battery effects, Electronics Letters, Jun. 28, 2018, vol. 54, No. 13, pp. 789-800.
Qu et al., Decoupling between ground radiation antennas with ground-coupled loop-type isolator for WLAN applications, IET Microwaves, Atennas & Propagation, 2018, pp. 546-552.
Liu et al., Loop-type ground antenna using resonated loop feeding, intended for mobile devices, Electronics Letters, Mar. 31, 2011, vol. 47, No. 7, 2 pgs.
Piao et al., MIMO Ground-Radiation Antennas Using a Novel Closed-Decoupling-Loop for 5G Applications, IEEE 2020, p. 142714-142724.
Kim et al., Miniaturized dual-band loop-type ground radiation antenna with enhanced bandwidth for mobile devices, Microw Opt Technol Lett., 2019, pp. 239-243.
Zahid et al., Performance evaluation of loop-type ground radiation antenna based on its optimum impedance level, Electronics Letters, Mar. 30, 2017, vol. 53, No. 7, pp. 446-448.
Hassan et al., A wideband loop-type ground radiation atenna using ground mode tuning and optimum impedance level, microw Opt Technol Lett., 2019, pp. 1-6.
Johanson Technology, *High Frequency Ceramic Solutions*, 5 pgs., Oct. 12, 2020.
Office communication in U.S. Appl. No. 16/237,511, 15 pgs.
Office communication in U.S. Appl. No. 16/719,925, 15 pgs.
Office communication in U.S. Appl. No. 16/724,160, 28 pgs.
Search report in CN application 201911132444X, 2 pgs.
Office communication in U.S. Appl. No. 15/845,327, 3 pgs.
Office communication in U.S. Appl. No. 16/237,511, 22 pgs.
Office communication in U.S. Appl. No. 16/719,925, 18 pgs.
Office communication in U.S. Appl. No. 16/719,925, 22 pgs.
Office communication in U.S. Appl. No. 17/705,260, 9 pgs.
Office communication in U.S. Appl. No. 16/719,925, 28 pgs.

* cited by examiner

RADIO-FREQUENCY APPARATUS WITH MULTI-BAND BALUN WITH IMPROVED PERFORMANCE AND ASSOCIATED METHODS

CROSS-REFERENCE TO RELATED APPLICATIONS

This application is related to, and hereby incorporates by reference in its entirety for all purposes, U.S. patent application Ser. No. 15/845,327, filed on Dec. 18, 2017, titled "Radio-Frequency Apparatus with Multi-Band Balun and Associated Methods,".

TECHNICAL FIELD

The disclosure relates generally to radio-frequency (RF) apparatus and, more particularly, to apparatus for multi-band matching baluns with improved performance, and associated methods.

BACKGROUND

With the increasing proliferation of wireless technology, such as Wi-Fi, Bluetooth, and mobile or wireless Internet of things (IoT) devices, more devices or systems incorporate RF circuitry, such as receivers and/or transmitters. To reduce the cost, size, and bill of materials, and to increase the reliability of such devices or systems, various circuits or functions have been integrated into integrated circuits (ICs). For example, ICs typically include receiver and/or transmitter circuitry.

The RF ICs typically work with circuitry external to the IC to provide a wireless solution. Examples of the external circuitry include baluns, matching circuitry, antennas, filters, switches, and the like.

The description in this section and any corresponding figure(s) are included as background information materials. The materials in this section should not be considered as an admission that such materials constitute prior art to the present patent application.

SUMMARY

A variety of apparatus and associated methods are contemplated according to exemplary embodiments. According to one exemplary embodiment, an apparatus includes an RF apparatus, and a multi-band matching balun coupled to the RF apparatus. The multi-band matching balun includes at least one three-element frequency-dependent resonator (TEFDR) and at most three reactive elements.

According to another exemplary embodiment, an apparatus includes an RF apparatus, and a multi-band matching balun coupled to the RF apparatus. The multi-band matching balun includes at least one three-element frequency-dependent resonator and at most three lumped reactive elements (LREs). Neither the at least one three-element frequency-dependent resonator nor the at most three lumped reactive elements includes variable or tunable capacitors or inductors.

According to another exemplary embodiment, a method of operating an apparatus, that includes an RF apparatus, includes using a multi-band matching balun coupled to the RF apparatus to provide impedance matching and balun functionality. The multi-band matching balun includes at least one three-element frequency-dependent resonator (TEFDR) and at most three reactive elements.

BRIEF DESCRIPTION OF THE DRAWINGS

The appended drawings illustrate only exemplary embodiments and therefore should not be considered as limiting the scope of the application or the claims. Persons of ordinary skill in the art will appreciate that the disclosed concepts lend themselves to other equally effective embodiments. In the drawings, the same numeral designators used in more than one drawing denote the same, similar, or equivalent functionality, components, or blocks.

DETAILED DESCRIPTION

Figure 1:
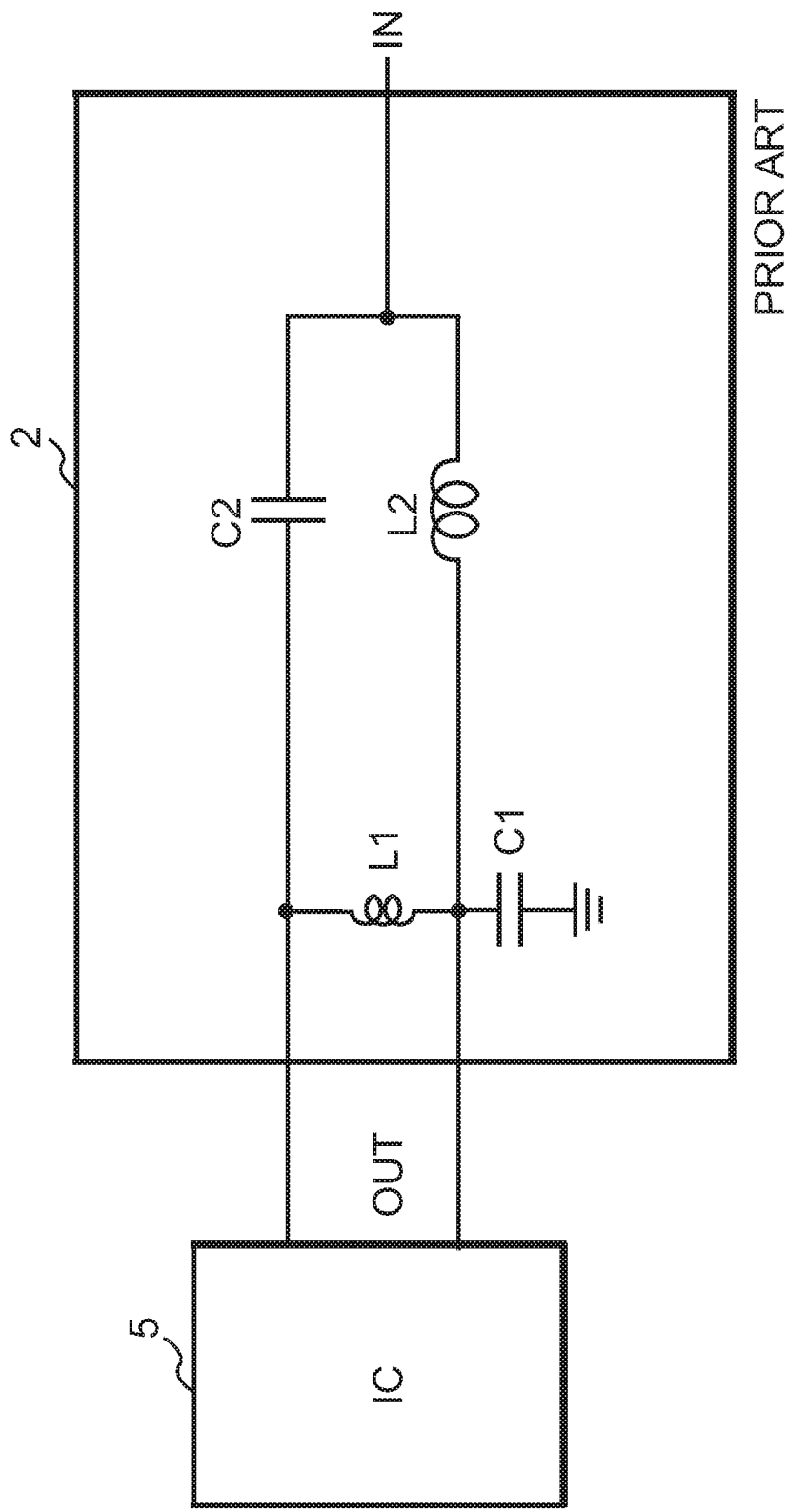
FIG. 1 shows a circuit arrangement using a conventional balun.

The disclosed concepts relate generally to RF apparatus and, more particularly, to multi-band matching baluns, i.e., apparatus that provides the combined functionality of impedance matching circuits (or impedance matching networks or impedance matching circuitry or matching circuit or matching networks or matching circuitry) and baluns, and associated methods.

Impedance matching or impedance transformation circuits are typically used in RF apparatus, such as receivers, transmitters, and/or transceivers, to provide an interface or match between circuitry that have different impedances.

More specifically, in the case of purely resistive impedances, maximum power transfer takes place when the output impedance of a source circuit equals the input impedance of a load circuit. In the case of complex impedances, maximum power transfer takes place when the input impedance of the load circuit is the complex conjugate of the output impedance of the source circuit.

As an example, consider an antenna with a 50-ohm impedance (R=50Ω) coupled to a receive or receiver (RX) circuit with a 50-ohm impedance. In this case, maximum power transfer takes place without the user of an impedance matching circuit because the output impedance of the antenna equals the input impedance of the RX circuit.

Now consider the situation where an antenna with a 50-ohm impedance (R=50Ω) coupled to an RX circuit with a 250-ohm impedance. In this case, because the respective impedances of the antenna and the RX circuit are not equal, maximum power transfer does not take place.

Use of an impedance matching circuit, however, can match the impedance of the antenna to the impedance of the RX circuit. As a result of using the impedance matching circuit, maximum power transfer from the antenna to the RX circuit takes place.

More specifically, the impedance matching circuit is coupled between the antenna and the RX circuit. The impedance matching circuit has two ports, with one port coupled to the antenna, and another port coupled to the RX circuit, respectively.

At the port coupled to the antenna, the impedance matching circuit ideally presents a 50-ohm impedance to the antenna. As a result, maximum power transfer takes place between the antenna and the impedance matching circuit.

Conversely, at the port coupled to the RX circuit, the impedance matching circuit presents a 250-ohm impedance to the RX circuit. Consequently, maximum power transfer takes place between the impedance matching circuit and the RX circuit.

In practice, the impedance matching circuit often fails to perfectly match the impedances. In other words, signal transmission from one network to another is not perfect and 100% of the signal power is not transmitted. As a result, reflection occurs at the interface between circuits or networks with imperfectly matched impedances.

The reflection coefficient, S11, may serve as one measure or figure of merit for the level of impedance matching. A lower S11 denotes better power transmission (better impedance matching), and vice-versa.

As noted, the optimum load impedance (e.g., input impedance of receive circuitry, such as the input impedance of a low-noise amplifier (LNA)) for matching purposes would be the complex conjugate of the source impedance (e.g., an antenna). However, due to the relatively high-Q (quality factor) of the input impedance of the receive circuitry, conjugate impedance match might prove relatively difficult or even impossible. As a compromise, impedances may be matched for maximum voltage gain, i.e., highest impedance where the input capacitance of the LNA (CLNA) is resonated out by the impedance matching circuitry (multi-band matching balun).

Baluns provide a way of interfacing a balanced circuit (e.g., differential input or output) with an unbalanced circuit (e.g., single-ended input or output). Baluns are typically used to interface RX circuits or transmit or transmitter (TX) circuit with differential inputs or outputs, respectively, to a single-ended antenna.

FIG. 1 shows a circuit arrangement using a conventional balun 2 coupled to an IC 5. Balun 2 includes four components or elements, i.e., inductor L1, inductor L12, capacitor C1, and capacitor C12. Balun 2 is typically coupled to RX circuitry (not shown) in IC 5. Balun 2 matches the impedance at the input (say, 50Ω) to the input impedance of the circuitry in IC 5, such as the input impedance of RX circuitry, typically 100-200Ω. Thus, for circuitry with higher input impedance, use of balun 2 results in relatively high impedance mismatch, which in turns results in power loss.

As known to persons of ordinary skill in the art, balun 2 constitutes a single-frequency balun. In other words, balun 2 provides a reasonable S11 value (say, −10 dB) at a single frequency, or within a single relatively narrow frequency band.

Various embodiments according to the disclosure combine the functionality of multi-band matching circuits and the functionality of baluns, i.e., the provide matching baluns. Matching baluns according to various embodiments provide not only impedance matching functionality, but also balun functionality in multiple frequency bands.

In exemplary embodiments, matching baluns and associated methods are disclosed. The matching baluns are relatively low cost, may be used with RF receivers, RF transmitters, and/or RF transceivers. Matching baluns according to various embodiments have relatively high Q (quality factor), and differential TX and/or RX ports.

Furthermore, matching baluns according to various embodiments may be adapted to various operating frequency ranges, power levels, and RX circuit or RX and TX circuit impedances. In addition, matching baluns according to various embodiments may be used with a variety of RX or RX and TX circuit configurations, as desired.

As noted above, matching baluns according to various embodiments realize both the balun and impedance-matching functions (e.g., 50-ohm single-ended to 750-ohm differential) in multiple frequency bands, i.e., the matching baluns can work well simultaneously in two separate bands. In some embodiments, the frequency bands might include 310-370 MHz±10%, 370-434 MHz±10%, and 868-928 MHz±10%.

As persons of ordinary skill in the art will understand, however, the disclosed concepts may be used to provide multi-band matching baluns for other frequency bands. Other frequency bands may be accommodated by making appropriate modifications to the component values used in the multi-band matching baluns, as persons of ordinary skill in the art will understand.

Multi-band matching baluns according to various embodiments use 12, 10, 8, or 6 elements or components (capacitors, inductors), such as lumped surface mount device (SMD) components (or other lumped components). The components are fixed-value components, i.e., they are not and do not include tunable or variable components (i.e., no inductor or capacitor whose inductance or capacitance, respectively, may be varied or tuned), nor are they switchable components, nor do they use multiple paths (i.e., use of more than one path in the RF front-end matching circuit and, thus, multiple inputs and/or outputs for different frequency bands (plus applying couplers, splitters, diplexers, and/or multiplexers) or use of RF switches), as are used conventionally.

In some embodiments, rather than using lumped components, distributed components may be used to realize matching baluns, as desired, and as persons of ordinary skill in the art will understand. Multi-band matching baluns intended for relatively high frequencies, such as over a gigahertz or other desired frequency value, may be realized using distributed components, as persons of ordinary skill in the art will understand.

Some exemplary embodiments are described with component values and/or impedance values and/or configurations for particular frequency bands and/or for particular RX and/or TX circuitry. Such embodiments are merely illustrative and are not intended and should not be construed as limiting the disclosed concepts.

As persons of ordinary skill in the art will understand, the concepts for multi-band matching baluns are not limited to those exemplary or illustrative frequency values or impedance levels (e.g., input impedance of RX circuitry). Multi-band matching baluns that accommodate other frequency bands and/or impedance values may be designed and realized by making appropriate modifications or designing appropriate multi-band matching baluns, as persons of ordinary skill in the art will understand.

Figure 2:
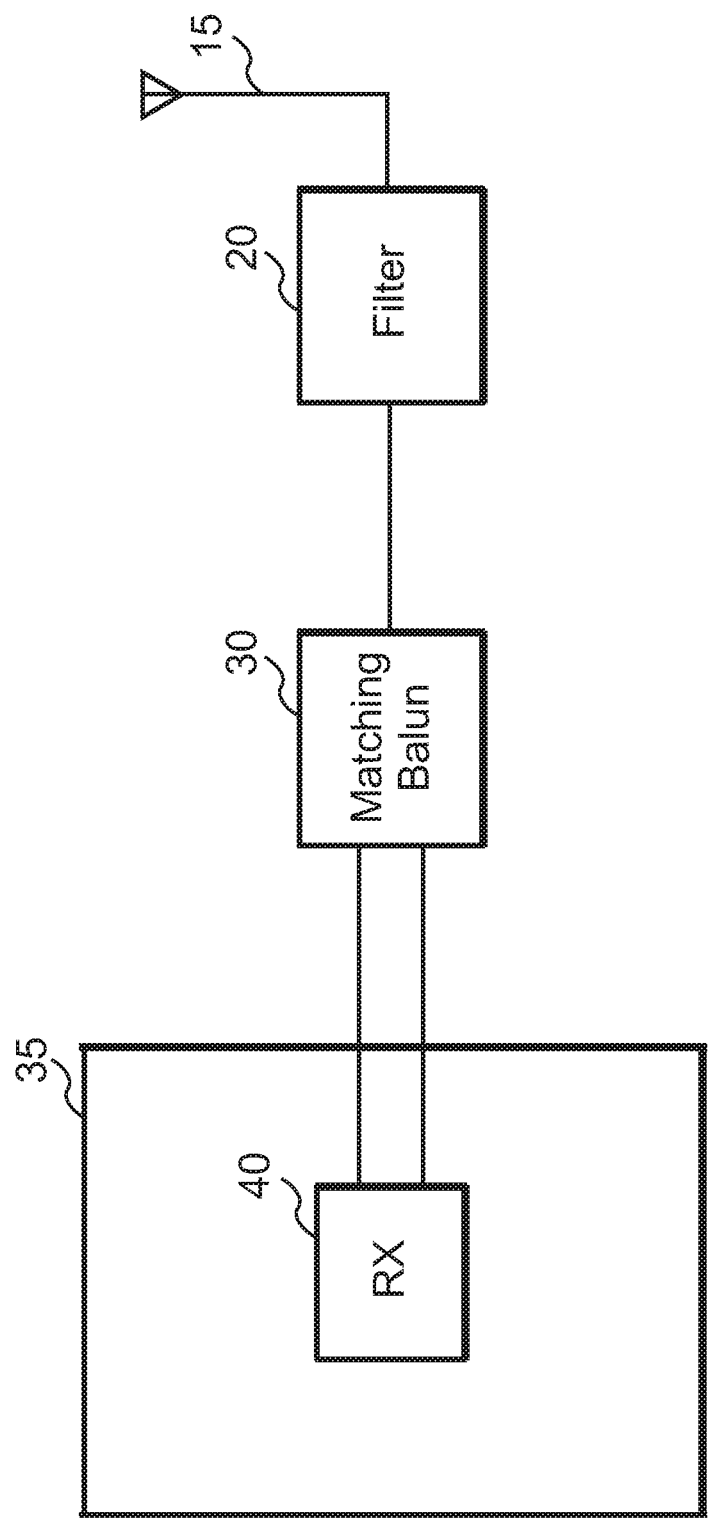
FIG. 2 shows a circuit arrangement for an RF apparatus with a multi-band matching balun according to an exemplary embodiment.

As noted above, multi-band matching baluns according to various embodiments may be used in a variety of apparatus. FIG. 2 shows a circuit arrangement for an RF apparatus with a multi-band matching balun 30 according to an exemplary embodiment.

More specifically, The embodiment in FIG. 2 shows an RF apparatus 35 that has RX functionality, i.e., by using RX circuitry 40. Antenna 15 receives RF signals and provides the signals to filter 20. Filter 20 is coupled to matching balun 30.

Multi-band matching balun 30 matches the output impedance of filter 20 to the input impedance of RX circuitry 40. Multi-band matching balun 30 also provides balun functionality, as described above. More specifically, multi-band matching balun 30 couples or interfaces the single-ended output of filter 20 to the differential input of RX circuitry 40.

Figure 3:
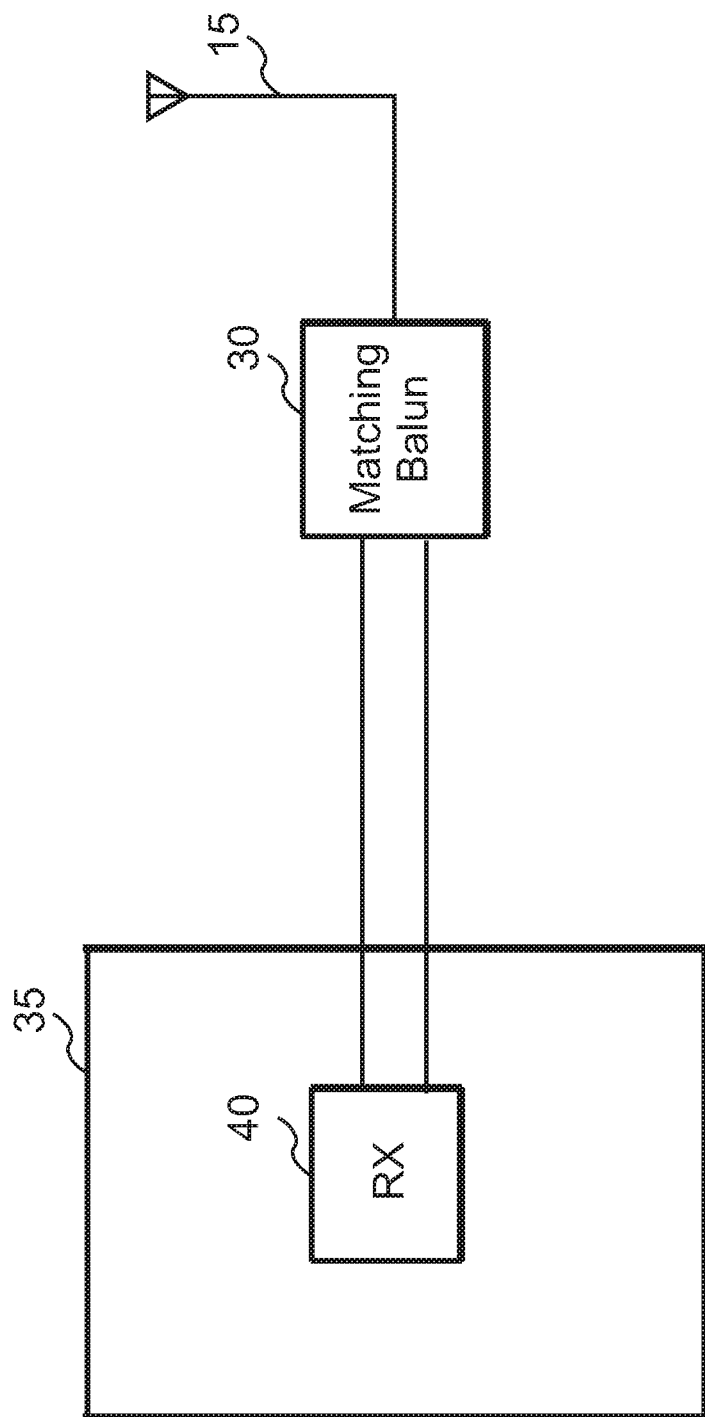
FIG. 3 shows a circuit arrangement for an RF apparatus with a multi-band matching balun according to another exemplary embodiment.

Note that filter 20 is optional in various embodiments, and may be omitted. More specifically, filter 20 is typically used if higher selectivity or blocking is desired. FIG. 3 shows a circuit arrangement for an RF apparatus with a multi-band matching balun 30 according to another exemplary embodiment. In this exemplary embodiment, filter 20 is omitted, and antenna 15 is coupled to multi-band matching balun 30.

Multi-band matching balun 30 matches the impedance of antenna 15 (typically 50Ω) to the input impedance of RX circuitry 40. Multi-band matching balun 30 also provides balun functionality, as described above. More specifically, multi-band matching balun 30 couples or interfaces the single-ended output of antenna 15 to the differential input of RX circuitry 40.

Figure 4:
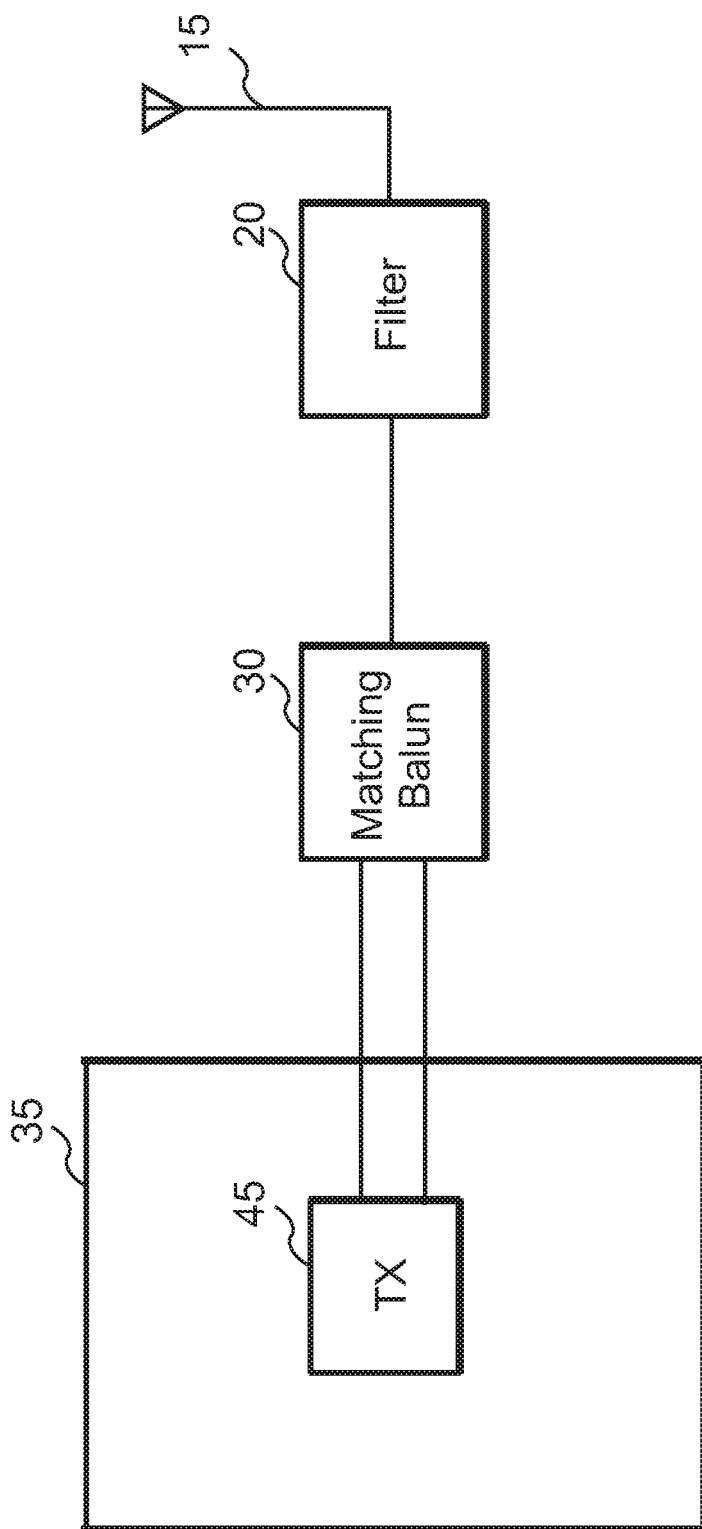
FIG. 4 shows a circuit arrangement for an RF apparatus with a multi-band matching balun according to another exemplary embodiment.

As noted above, multi-band matching baluns according to various embodiments may also be used in RF apparatus that include TX functionality. FIG. 4 shows a circuit arrangement for an RF apparatus that includes TX circuitry 45 and multi-band matching balun 30 according to another exemplary embodiment.

TX circuitry 45 provides RF signals to be transmitted (typically through a power amplifier (not shown) to multi-band matching balun 30. Multi-band matching balun 30 is coupled to filter 20. Filter 20 filters the RF signals, and provides the filtered RF signals to antenna 15. The filtered RF signals are transmitted via antenna 15.

Multi-band matching balun 30 matches the output impedance of TX circuitry 45 to the input impedance of filter 20. Multi-band matching balun 30 also provides balun functionality, as described above. More specifically, multi-band matching balun 30 couples or interfaces the single-ended input of filter 20 to the differential output of TX circuitry 45.

Note that filter 20 is optional in various embodiments, and may be omitted. More specifically, filter 20 is typically used if the TX mode of operation generates higher harmonics than allowed by the applicable or desired standards or are desired.

Figure 5:
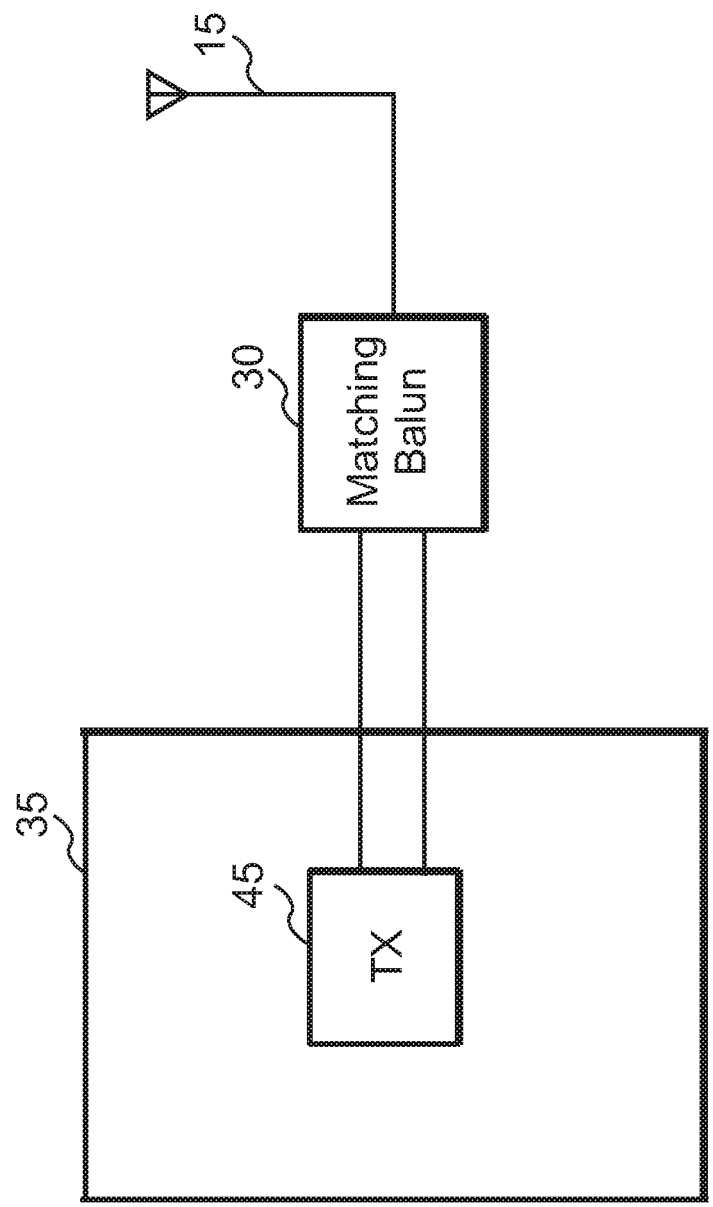
FIG. 5 shows a circuit arrangement for an RF apparatus with a multi-band matching balun according to another exemplary embodiment.

FIG. 5 shows a circuit arrangement for an RF apparatus with a multi-band matching balun 30 according to another exemplary embodiment. In this exemplary embodiment, filter 20 is omitted, and antenna 15 is coupled to multi-band matching balun 30.

Multi-band matching balun 30 matches the impedance of antenna 15 (typically 50Ω) to the output impedance of TX circuitry 45. Multi-band matching balun 30 also provides balun functionality, as described above. More specifically, multi-band matching balun 30 couples or interfaces the single-ended input of antenna 15 to the differential output of TX circuitry 45.

Note that multi-band matching balun 30 may also be used in RF apparatus that have both RX and TX functionality, i.e., transceivers. In such embodiments, various techniques, such as RX-TX switches and/or direct coupling of RX circuitry and TX circuitry to balun/impedance matching circuitry may be used, as persons of ordinary skill in the art will understand. One or more multi-band matching baluns 30 may be used to provide impedance-matching and balun functionality, as described above.

One aspect of the disclosure relates to the use of three-element frequency-dependent resonators (TEFDRs) to realize multi-band matching baluns. In various embodiments, one or more three-element frequency-dependent resonators may be used to replace corresponding component(s) in a balun.

Generally speaking, and as described in more details in connection with the exemplary embodiments shown in the figures, multi-band matching baluns according to various embodiments may use one, two, three, or four TEFDRs, or at least one TEFDR. In addition, the multi-band matching baluns may use zero, one, two, or three reactive lumped elements (LREs), such as inductors or capacitors (e.g., balun 2 in FIG. 1 uses four LREs, i.e., two capacitors, and two inductors), or at most three LREs.

The three-element frequency-dependent resonators use fixed-value (fixed capacitance or inductance value, not variable, tunable, or switchable) components, such as lumped capacitors and/or inductors. The three-element frequency-dependent resonators provide the functionality of an inductor or capacitor. Unlike a fixed-value inductor or capacitor, however, the inductance or capacitance of three-element frequency-dependent resonators varies as a function of frequency without the use of variable, tunable, or switchable inductors or capacitors.

Note that, as described above, rather than using exclusively lumped elements, other arrangements may be used to realize reactive components (inductors, capacitors) in multi-band matching baluns according to various embodiments. Thus, in some embodiments, distributed reactive elements (DREs), such as distributed inductors and/or capacitors, may be used in multi-band matching baluns instead of LREs. In some embodiments, a combination of LREs and DREs may be used, as desired, to implement multi-band matching baluns. Note further that the reactive components or elements may be used either individually (e.g., a capacitor or inductor in a multi-band matching balun), or in combination with other reactive elements to realize TEFDRs (e.g., a capacitor and two inductors used to realize a TEFDR that is used in a multi-band matching balun).

Figure 6:
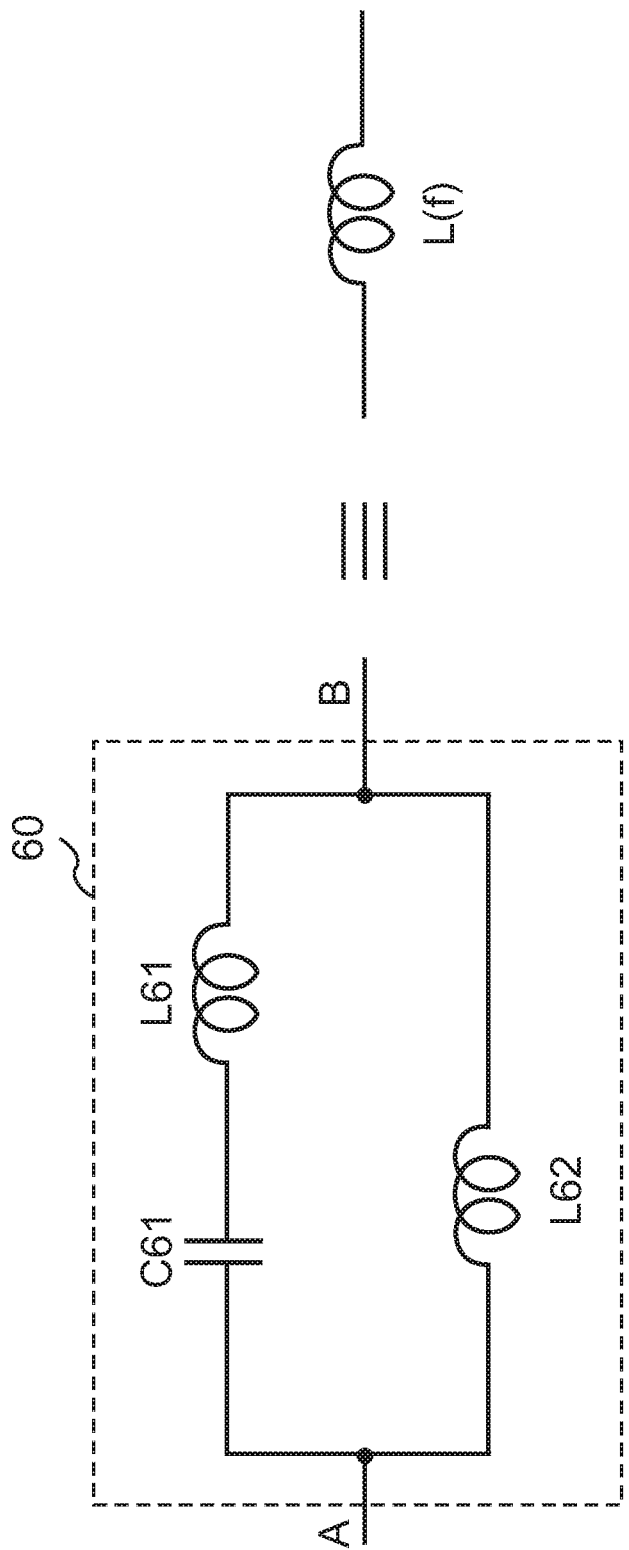
FIG. 6 shows a three-element frequency-dependent resonator according to an exemplary embodiment.
Figure 7:
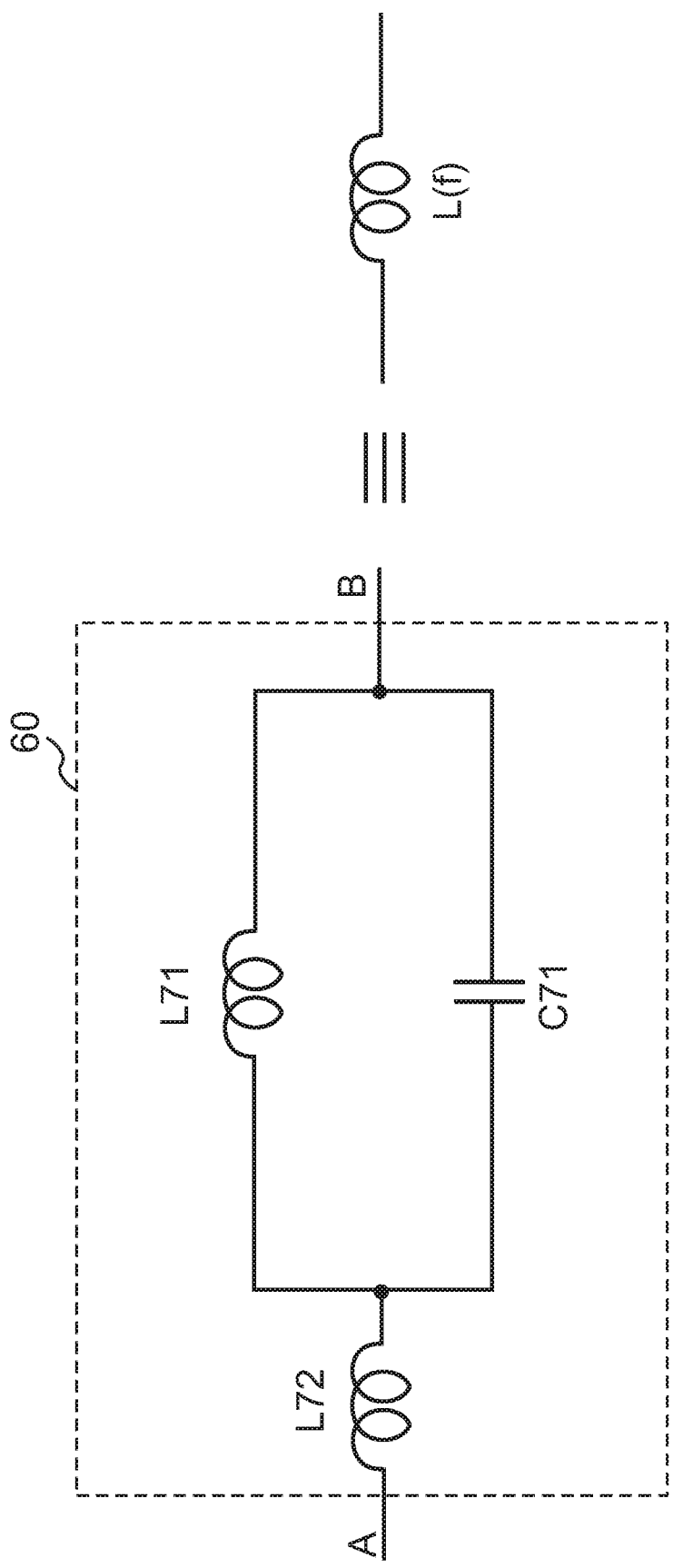
FIG. 7 shows a three-element frequency-dependent resonator according to another exemplary embodiment.
Figure 8:
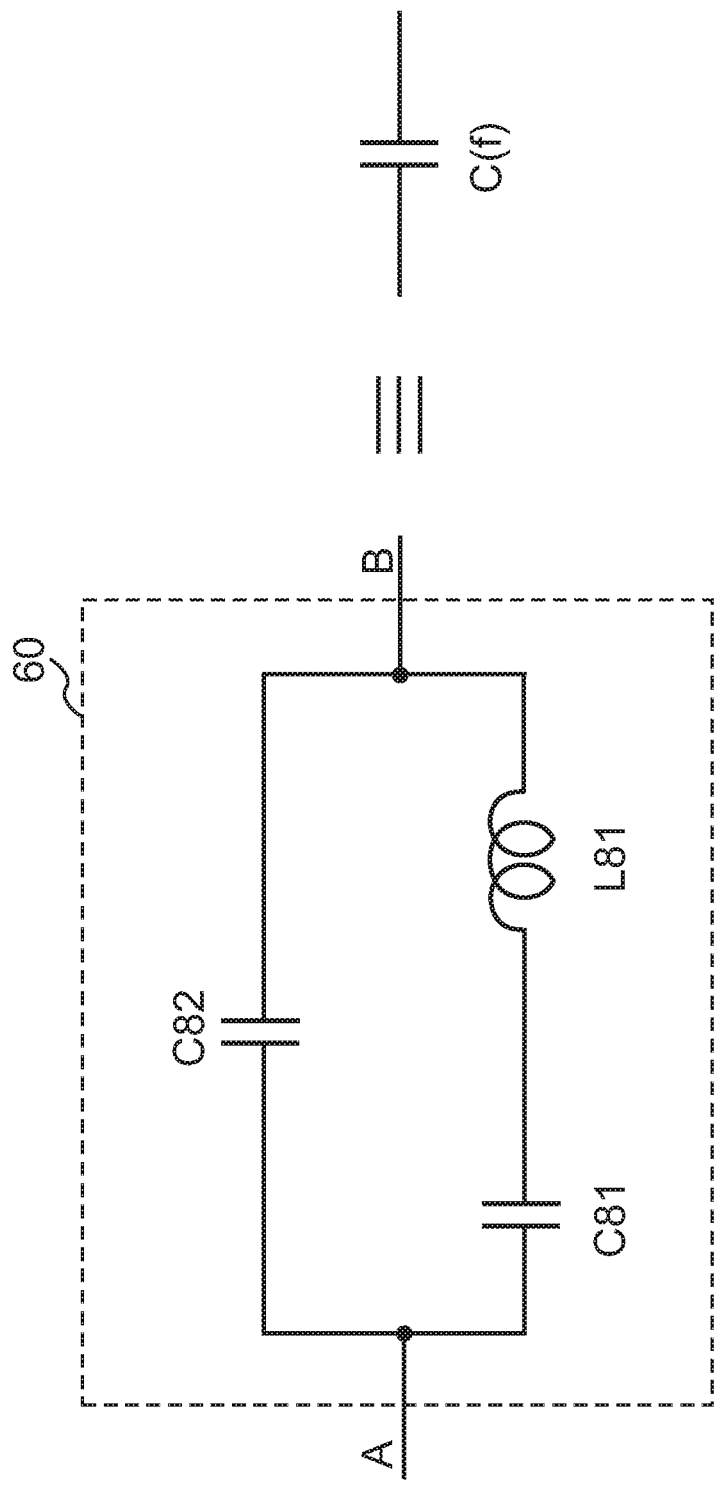
FIG. 8 shows a three-element frequency-dependent resonator according to another exemplary embodiment.
Figure 9:
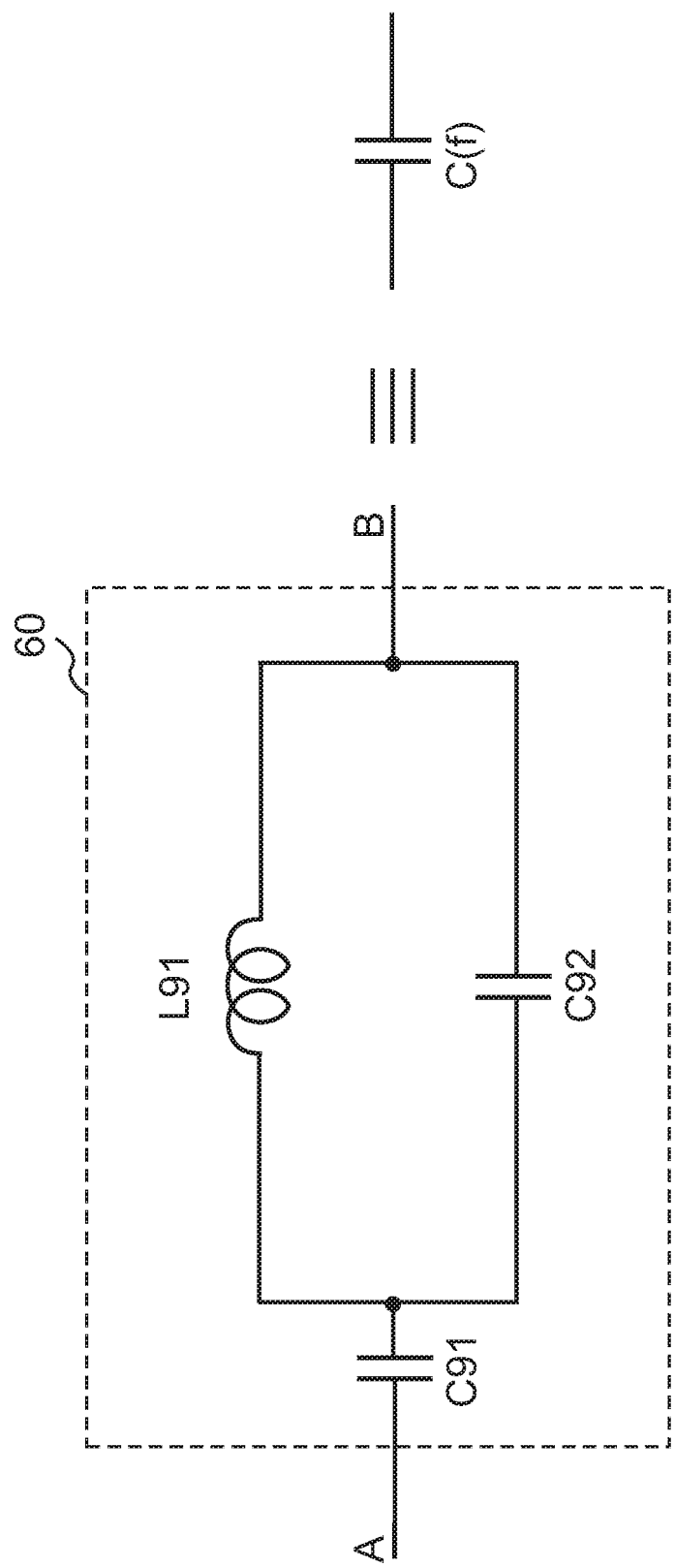
FIG. 9 shows a three-element frequency-dependent resonator according to another exemplary embodiment.

FIGS. 6-9 show three-element frequency-dependent resonators according to exemplary embodiments. More specifically, FIGS. 6-7 show three-element frequency-dependents that may be used to replace an inductor in a balun. Conversely, FIGS. 8-9 show three-element frequency-dependents that may be used to replace a capacitor in a balun, such as balun 2 shown in FIG. 1, in order to realize multi-band matching baluns.

The three-element frequency-dependent resonators can be used as frequency-dependent components (with lower inductance or capacitance at a higher band) and thus they are able to serve as building blocks of more complex circuits, which resonate simultaneously in multiple frequency bands. As a result, by using three-element frequency-dependent resonators, multi-band matching baluns may be realized, as described below in detail.

Referring to FIG. 6, a three-element frequency-dependent resonator 60 is shown coupled between points A and B. Three-element frequency-dependent resonator 60 includes capacitor C61, inductor L61, and inductor L62, all of which have fixed (not variable, tunable, or switchable) capacitance and inductance values, respectively, and may be realized by using lumped components, as described above.

Capacitor C61 is coupled to point A and also in series with inductor L61. Inductor L61 is also coupled to point B. Inductor L62 is coupled between points A and B, i.e., in parallel with the series combination of capacitor C61 and inductor L61.

As shown, the three-element frequency-dependent resonator 60 is equivalent to an inductor L(f), where "(f)" denotes dependence of inductance on frequency, i.e., the inductance of L(f) is a function of frequency. Unlike a traditional inductor, the inductance of three-element frequency-dependent resonator 60 varies as a function of frequency. The following formulas provide a technique for calculating the values of the components in three-element frequency-dependent resonator 60 (with L1 corresponding to L62, C3 corresponding to C61, and L3 corresponding to L61 in the figure):

$$Z = j*2\pi f * L1 * \frac{1-(2\pi f)^2 * L3 * C3}{1-(2\pi f)^2 * C3 * (L1+L3)}$$

$$\omega_x = 2\pi f_x$$

$$L3 = \frac{X1*X2}{X1-X2} * \frac{\omega_1^2 - \omega_2^2}{\omega_0^2 - \omega_1^2 - \omega_2^2 + \frac{\omega_1^2 \omega_2^2}{\omega_0^2}}$$

$$L1 = X1 * \frac{\omega_0^2 - \omega_1^2}{\omega_0^2 - \omega_1^2 + \frac{\omega_1^2 * X1}{L3}}$$

$$C3 = \frac{1}{\omega_0^2 * L3}$$

where Z, j, f, L1, L3, C3, and w denote, respectively, impedance, the imaginary unit, frequency, the inductance of the L1 component, the inductance of the L3 component, the capacitance of the C3 component, and the angular frequency. X1 denotes the desired inductance at $f_1$, and X2 denotes the desired inductance at $f_2$, where $f_1<f_2$, X1>X2, and Z=jωX, and where $\omega_1<\omega_o<\omega_2$. The quantity $f_o$ is the series resonant point, which should be at the frequency $(f_1+f_2)/2$, but other values—between $f_1$ and $f_2$—may be used, as desired.

Referring to FIG. 7, a three-element frequency-dependent resonator 60 is shown coupled between points A and B. Three-element frequency-dependent resonator 60 includes capacitor C71, inductor L71, and inductor L72, all of which have fixed (not variable, tunable, or switchable) capacitance and inductance values, respectively, and may be realized by using lumped components, as described above.

The parallel combination of capacitor C71 and inductor L71 is coupled to inductor L72 and to point B. Inductor L72 is also coupled to point A.

As shown, the three-element frequency-dependent resonator is equivalent to an inductor L(f), where "(f)" denotes dependence of inductance on frequency, i.e., the inductance of L(f) is a function of frequency. Unlike a traditional inductor, the inductance of three-element frequency-dependent resonator 60 varies as a function of frequency. The following formulas provide a technique for calculating the values of the components in three-element frequency-dependent resonator 60 (with L1 corresponding to L72, C3 corresponding to C71, and L3 corresponding to L71 in the figure):

$$Z = j*2\pi f * \left(L1 * \frac{L3}{1-(2\pi f)^2 * L3 * C3}\right)$$

$$\omega_x = 2\pi f_x$$

$$L3 = \frac{X1-X2}{\frac{\omega_0^2}{\omega_0^2-\omega_1^2} - \frac{\omega_0^2}{\omega_0^2-\omega_2^2}}$$

$$L1 = X2 - L3 * \frac{\omega_0^2}{\omega_0^2-\omega_2^2}$$

$$C3 = \frac{1}{\omega_0^2 * L3}$$

where Z, j, f, L1, L3, C3, and w denote, respectively, impedance, the imaginary unit, frequency, the inductance of the L1 component, the inductance of the L3 component, the capacitance of the C3 component, and the angular frequency. X1 denotes the desired inductance at $f_1$, and X2 denotes the desired inductance at $f_2$, where $f_1<f_2$, X1>X2, and Z=jωX, and where $\omega_1<\omega_o<\omega_2$. The quantity $f_o$ is the parallel resonant point, which should be at the frequency $(f_1+f_2)/2$, but other values—between $f_1$ and $f_2$—may be used, as desired.

As noted above, FIGS. 8-9 show three-element frequency-dependents that may be used to replace a capacitor, e.g., a capacitor used in a balun, such as balun 2 in FIG. 1. Referring to FIG. 8, a three-element frequency-dependent resonator 60 is shown coupled between points A and B. Three-element frequency-dependent resonator 60 includes capacitor C81, inductor L81, and capacitor C82, all of which have fixed (not variable, tunable, or switchable) capacitance and inductance values, respectively, and may be realized by using lumped components, as described above.

Capacitor C81 is coupled to point A and also in series with inductor L81. Inductor L81 is also coupled to point B. Capacitor C82 is coupled between points A and B, i.e., in parallel with the series combination of capacitor C81 and inductor L81.

As shown, three-element frequency-dependent resonator 60 is equivalent to a capacitor C. However, unlike a traditional capacitor, the capacitance of the three-element frequency-dependent resonator varies as a function of frequency. The values of capacitor C81, inductor L81, and capacitor C82 may be calculated as follows (with C1 corresponding to C82, C3 corresponding to C81, and L3 corresponding to L81 in the figure):

$$Y = j*2\pi f * \left( C1 + \frac{C3}{1-(2\pi f)^2 * L3 * C3} \right)$$

$$\omega_x = 2\pi f_x$$

$$C3 = \frac{B1 - B2}{\frac{\omega_0^2}{\omega_0^2 - \omega_1^2} - \frac{\omega_0^2}{\omega_0^2 - \omega_2^2}}$$

$$C1 = B2 - C3 * \frac{\omega_0^2}{\omega_0^2 - \omega_2^2}$$

$$L3 = \frac{1}{\omega_0^2 * C3}$$

where Y, j, f, C1, L3, C3, and w denote, respectively, admittance, the imaginary unit, frequency, the capacitance of the C1 component, the inductance of the L3 component, the capacitance of the C3 component, and the angular frequency. B1 denotes the desired capacitance at $f_1$, and B2 denotes the desired capacitance at $f_2$, where $f_1<f_2$, B1>B2, and Y=jωB, and where $\omega_1<\omega_o<\omega_2$. The quantity $f_o$ is the series resonant point, which should be at the frequency $(f_1+f_2)/2$, but other values—between $f_1$ and $f_2$—may be used, as desired.

Referring to FIG. 9, a three-element frequency-dependent resonator 60 is shown coupled between points A and B. Three-element frequency-dependent resonator 60 includes capacitor C91, inductor L91, and capacitor C92, all of which have fixed (not variable, tunable, or switchable) capacitance and inductance values, respectively, and may be realized by using lumped components, as described above.

The parallel combination of capacitor C92 and inductor L91 is coupled to capacitor C91 and to point B. Capacitor C91 is also coupled to point A.

As shown, three-element frequency-dependent resonator 60 is equivalent to a capacitor C(f), where "(f)" denotes dependence of capacitance on frequency, i.e., the capacitance of C(f) is a function of frequency. Unlike a traditional capacitor, the capacitance of three-element frequency-dependent resonator 60 varies as a function of frequency. The values of capacitor C91, inductor L91, and capacitor C92 may be calculated as follows (with C1 corresponding to C91, C3 corresponding to C92, and L3 corresponding to L91 in the figure):

$$Y = j*2\pi f * C1 * \frac{1-(2\pi f)^2 * L3 * C3}{1-(2\pi f)^2 * L3 * (C1 + C3)}$$

$$\omega_x = 2\pi f_x$$

$$C3 = \frac{B1 * B2}{B1 - B2} * \frac{\omega_1^2 - \omega_2^2}{\omega_0^2 - \omega_1^2 - \omega_2^2 + \frac{\omega_1^2 \omega_2^2}{\omega_0^2}}$$

$$C1 = B1 * \frac{\omega_0^2 - \omega_1^2}{\omega_0^2 - \omega_1^2 + \frac{\omega_1^2 * B1}{C3}}$$

$$L3 = \frac{1}{\omega_0^2 * C3}$$

where Y, j, f, C1, L3, C3, and w denote, respectively, admittance, the imaginary unit, frequency, the capacitance of the C1 component, the inductance of the L3 component, the capacitance of the C3 component, and the angular frequency. B1 denotes the desired capacitance at $f_1$, and B2 denotes the desired capacitance at $f_2$, where $f_1<f_2$, B1>B2, and Y=jωB, and where $107_1<107_o<\omega_2$. The quantity $f_o$ is the parallel resonant point, which should be at the frequency $(f_1+f_2)/2$, but other values—between $f_1$ and $f_2$—may be used, as desired.

As noted above, three-element frequency-dependent resonators 60 may be used to implement multi-band matching baluns. As noted above, in various embodiments, one through four TEFDRs and zero through three LREs (or reactive elements or components, generally) are used to realize multi-band matching baluns.

Figure 10:
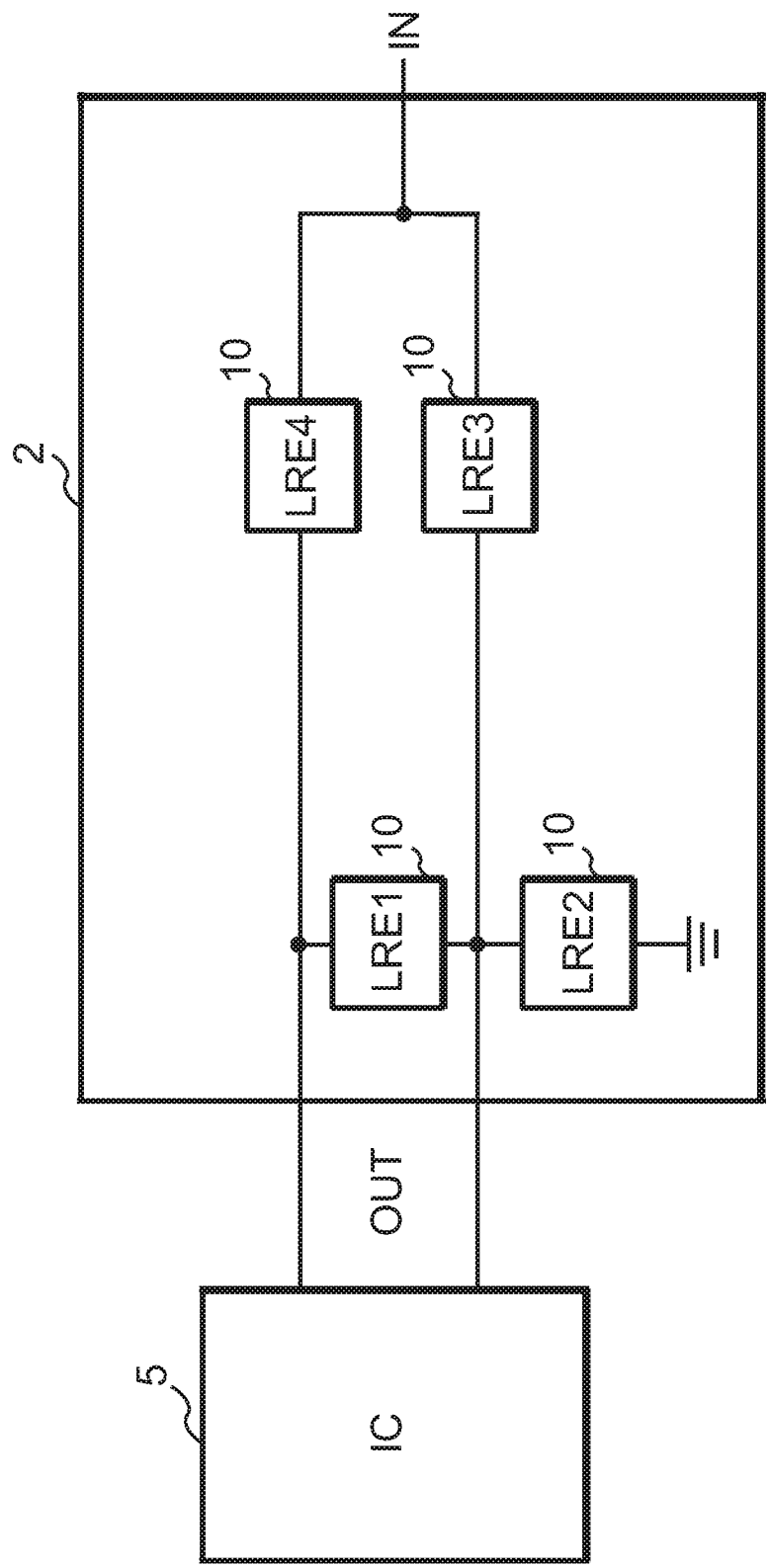
FIG. 10 shows a circuit arrangement for a balun with lumped reactive elements.

Generally speaking, multi-band matching baluns according to various embodiments are obtained by replacing one or more LREs in the circuit shown in FIG. 10. More specifically, balun 2 in FIG. 10 illustrates the balun of FIG. 1, but with the individual capacitors and inductors replaced with LREs. By replacing one, two, three, or four of the LREs with TEFDRs, multi-band matching baluns according to various embodiments are obtained.

One aspect of the disclosure relates to 12-element multi-band matching baluns. Twelve-element multi-band matching baluns are obtained by replacing all four LREs in FIG. 10 with TEFDRs. The TEFDRs may be any of the TEFDRs shown in FIGS. 6-9. Depending on the choice of TEFDRs to replace the LREs in FIG. 10, multi-band matching baluns with different and/or desired characteristics (e.g., frequency bands of operation) may be obtained.

Figure 11:
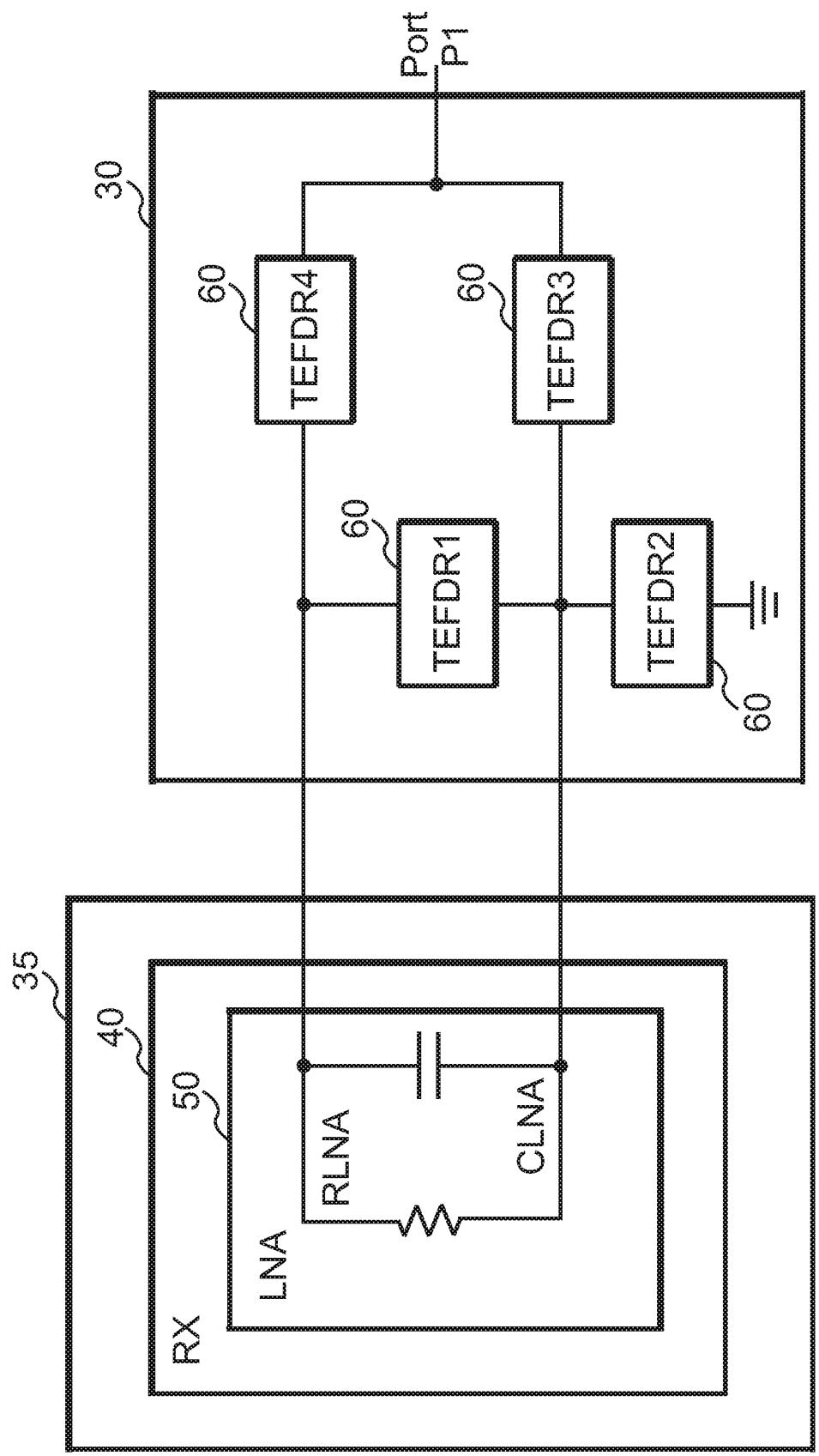
FIG. 11 shows a circuit arrangement for a 12-element multi-band matching balun according to an exemplary embodiment.

FIG. 11 shows a circuit arrangement for a 12-element multi-band matching balun 30 according to an exemplary embodiment. In this embodiment, all four LREs (i.e., LRE1-LRE4) in FIG. 10 are replaced with four corresponding TEFDRs (i.e., TEFDR1-TEFDR4).

Referring to FIG. 11, multi-band matching balun 30 is coupled to port P1 (e.g., single-ended antenna, filter, etc., with a given impedance, such as 50Ω). Multi-band matching balun 30 is also coupled to RF apparatus 35, more specifically, to the input of RX circuitry 40.

In the embodiment shown, the input of RX circuitry 40 includes LNA 50. The input circuit of LNA 50 is represented by a resistor RLNA (e.g., 750Ω) in parallel with a capacitor CLNA (e.g., 1.1 pF). Thus, multi-band matching balun 30 provides impedance matching between the impedance presented at port P1 and the input impedance of LNA 50.

As noted, twelve-element multi-band matching baluns are obtained by replacing all four LREs in FIG. 10 with TEFDRs to realize the circuit in FIG. 11. The TEFDRs may be any of the TEFDRs shown in FIGS. 6-9. Depending on the choice of TEFDRs to replace the LREs in FIG. 10, multi-band matching baluns with different and/or desired characteristics (e.g., frequency bands of operation) may be obtained.

Figure 12:
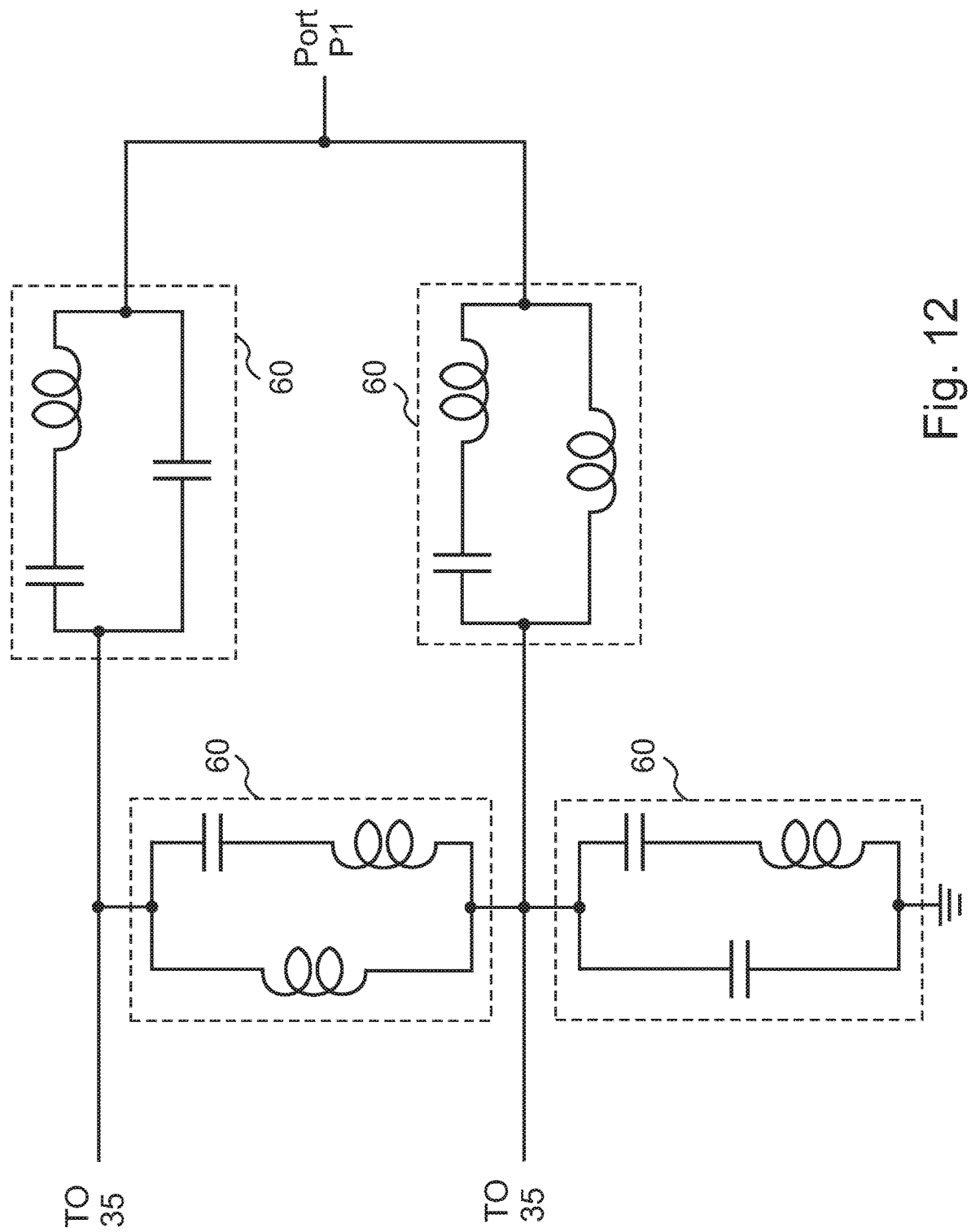
FIG. 12 shows a circuit arrangement for a 12-element multi-band matching balun according to an exemplary embodiment.

As merely one example, FIG. 12 shows a circuit arrangement for a 12-element multi-band matching balun 30 according to an exemplary embodiment. The multi-band matching balun shown in the exemplary embodiment of FIG. 12 is obtained by: (i) replacing LRE1 in FIG. 10 (or inductor L1 in FIG. 1) with TEFDR 60 shown in FIG. 6; (ii)

replacing LRE2 in FIG. 10 (or capacitor C1 in FIG. 1) with TEFDR 60 shown in FIG. 8; (iii) replacing LRE3 in FIG. 10 (or inductor L2 in FIG. 1) with TEFDR 60 shown in FIG. 6; and (iv) replacing LRE4 in FIG. 10 (or capacitor C2 in FIG. 1) with TEFDR 60 shown in FIG. 8.

Multi-band matching balun 30 in FIG. 12 illustrates merely one example of a 12-element multi-band matching balun, which uses TEFDRs 60 shown in FIGS. 6 and 8, but not TEFDRs 60 shown in FIGS. 7 and 9. Other possibilities exist and are contemplated for realizing 12-element multi-band matching baluns. For example, in some embodiments, rather than using TEFDR 60 shown in FIG. 6 to realize inductor L1 (and/or inductor L2) in FIG. 1, TEFDR 60 shown in FIG. 7 may be used. As another example, in some embodiments, TEFDR 60 shown in FIG. 6 may be used to realize inductor L1 in FIG. 1, and TEFDR 60 shown in FIG. 7 may be used to realize inductor L2.

Similar options exist with respect to realizing (or replacing) capacitors. For example, in some embodiments, rather than using TEFDR 60 shown in FIG. 8 to realize inductor C1 (and/or inductor L2) in FIG. 1, TEFDR 60 shown in FIG. 9 may be used. As another example, in some embodiments, TEFDR 60 shown in FIG. 8 may be used to realize capacitor C1 in FIG. 1, and TEFDR 60 shown in FIG. 8 may be used to realize capacitor C2. Similar possibilities exist and are contemplated with respect to 10-element, 8-element, and 6-element multi-band baluns, described below.

One aspect of the disclosure relates to 10-element multi-band matching baluns. Ten-element multi-band matching baluns are obtained by replacing three of four LREs in FIG. 10 with three corresponding TEFDRs. The TEFDRs may be any of the TEFDRs shown in FIGS. 6-9. Depending on the choice of TEFDRs to replace an LRE in FIG. 10, multi-band matching baluns with different and/or desired characteristics (e.g., frequency bands of operation) may be obtained.

Figure 13:
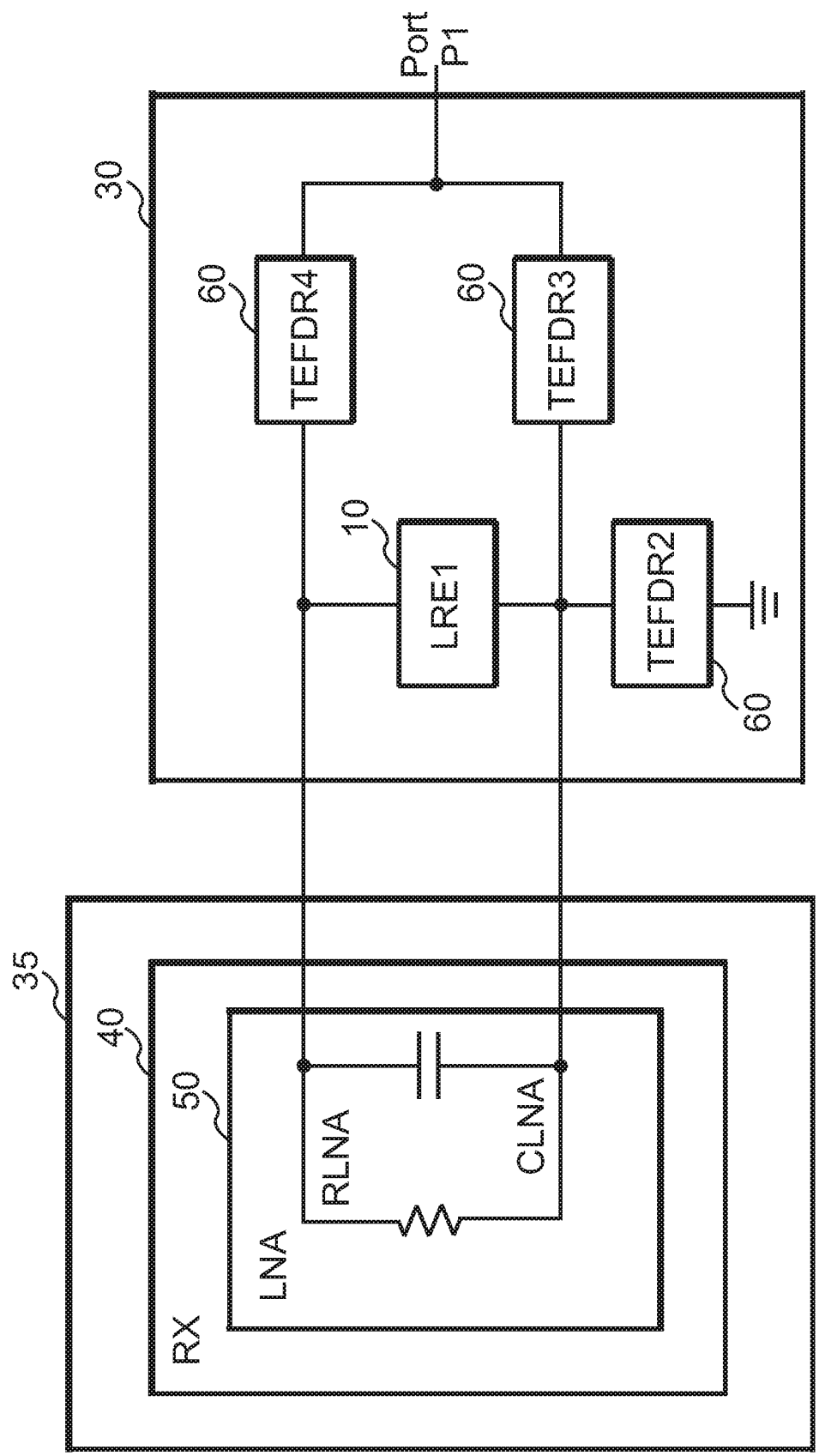
FIG. 13 shows a circuit arrangement for a 10-element multi-band matching balun according to an exemplary embodiment.

FIG. 13 shows a circuit arrangement for a 10-element multi-band matching balun 30 according to an exemplary embodiment. In this embodiment, LRE1 is not replaced with a corresponding TEFDR. The remaining LREs, i.e., LRE2-LRE4 in FIG. 10, are replaced with three corresponding TEFDRs (i.e., TEFDR2-TEFDR4) to realize multi-band matching balun 30 in FIG. 13.

Referring to FIG. 13, multi-band matching balun 30 is coupled to port P1 (e.g., single-ended antenna, filter, etc., with a given impedance, such as 50Ω). Multi-band matching balun 30 is also coupled to RF apparatus 35, more specifically, to the input of RX circuitry 40.

In the embodiment shown, the input of RX circuitry 40 includes LNA 50. The input circuit of LNA 50 is represented by a resistor RLNA (e.g., 750Ω) in parallel with a capacitor CLNA (e.g., 1.1 pF). Thus, multi-band matching balun 30 provides impedance matching between the impedance presented at port P1 and the input impedance of LNA 50.

As noted, 10-element multi-band matching baluns are obtained by replacing three of the four LREs in FIG. 10 with TEFDRs to realize the circuit in FIG. 13. The TEFDRs may be any of the TEFDRs shown in FIGS. 6-9. Depending on the choice of TEFDRs to replace the LREs in FIG. 10, multi-band matching baluns with different and/or desired characteristics (e.g., frequency bands of operation) may be obtained.

Figure 14:
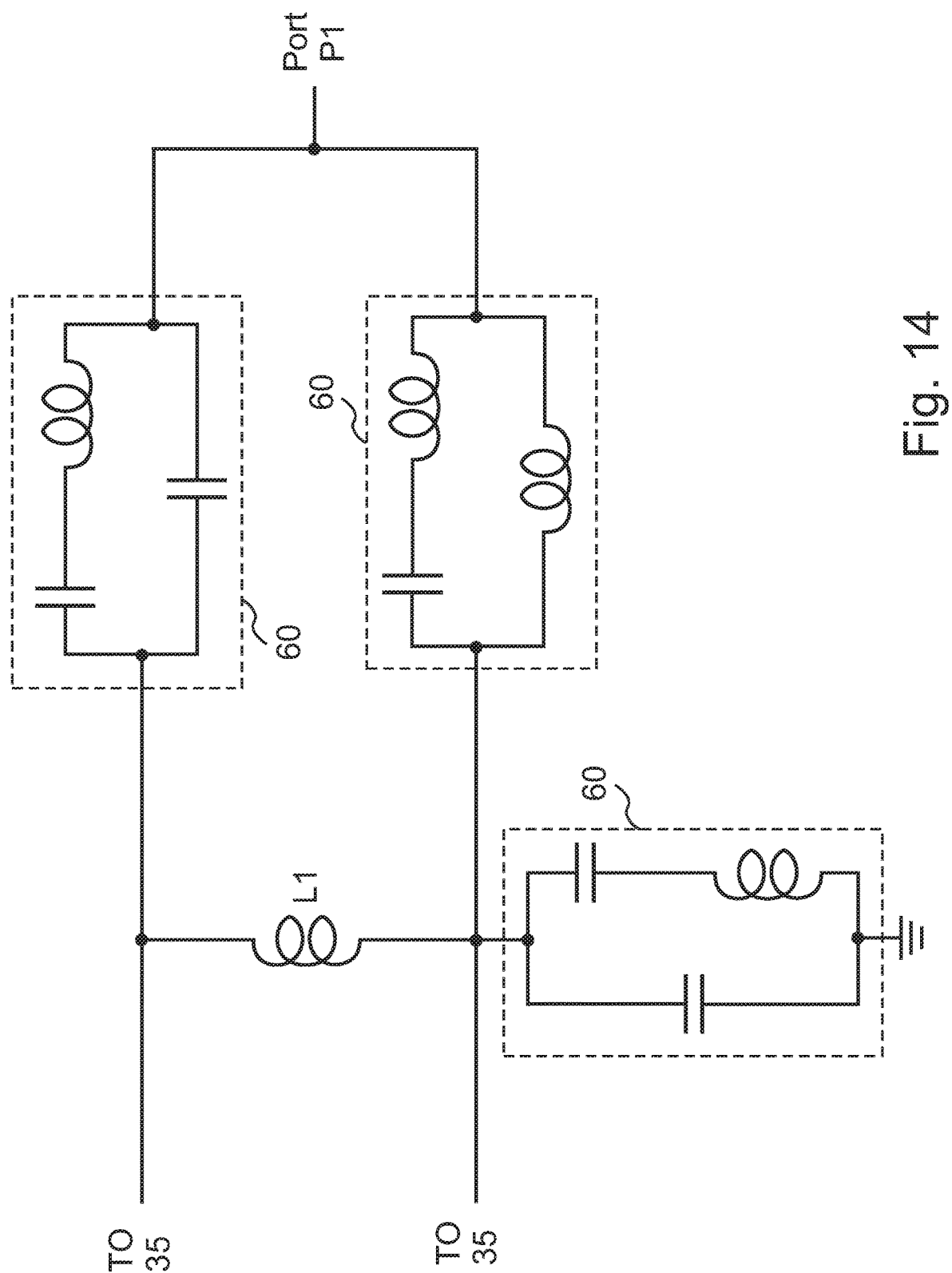
FIG. 14 shows a circuit arrangement for a 10-element multi-band matching balun according to an exemplary embodiment.

As merely one example, FIG. 14 shows a circuit arrangement for a 10-element multi-band matching balun 30 according to an exemplary embodiment. The multi-band matching balun shown in the exemplary embodiment of FIG. 14 is obtained by: (i) replacing LRE2 in FIG. 10 (or capacitor C1 in FIG. 1) with TEFDR 60 shown in FIG. 8; (ii) replacing LRE3 in FIG. 10 (or inductor L2 in FIG. 1) with TEFDR 60 shown in FIG. 6; and (ii) replacing LRE4 in FIG. 10 (or capacitor C2 in FIG. 1) with TEFDR 60 shown in FIG. 8. Note that inductor L1 (LRE1) has not been replaced with a TEFDR.

Multi-band matching balun 30 in FIG. 14 illustrates merely one example of a 10-element multi-band matching balun, which uses TEFDRs 60 shown in FIGS. 6 and 8, but not TEFDRs 60 shown in FIGS. 7 and 9. Other possibilities and varieties exist and are contemplated for realizing 10-element multi-band matching baluns, as described above with respect to 12-element multi-band matching baluns.

Generally speaking, 10-element multi-band matching baluns may be realized as follows (references are to the reactive components in FIG. 1):

L1 is kept as a single reactive component, and C1, L2, and C2 are replaced with corresponding TEFDRs selected from the embodiments shown in FIGS. 6-9;

L2 is kept as a single reactive component, and C1, L1, and C2 are replaced with corresponding TEFDRs selected from the embodiments shown in FIGS. 6-9;

C1 is kept as a single reactive component, and L1, L2, and C2 are replaced with corresponding TEFDRs selected from the embodiments shown in FIGS. 6-9; or C2 is kept as a single reactive component, and C1, L2, and L1 are replaced with corresponding TEFDRs selected from the embodiments shown in FIGS. 6-9.

As noted above, the TEFDRs selected to replace the corresponding LREs may be selected from TEFDRs 60 shown in FIGS. 6-9. Depending on the choice of TEFDRs, various multi-band matching balun with different characteristics (e.g., frequency bands of operation) may be obtained.

One aspect of the disclosure relates to 8-element multi-band matching baluns. Eight-element multi-band matching baluns are obtained by replacing two of four LREs in FIG. 10 with two corresponding TEFDRs. The TEFDRs may be any of the TEFDRs shown in FIGS. 6-9. Depending on the choice of TEFDRs to replace an LRE in FIG. 10, multi-band matching baluns with different and/or desired characteristics (e.g., frequency bands of operation) may be obtained.

Figure 15:
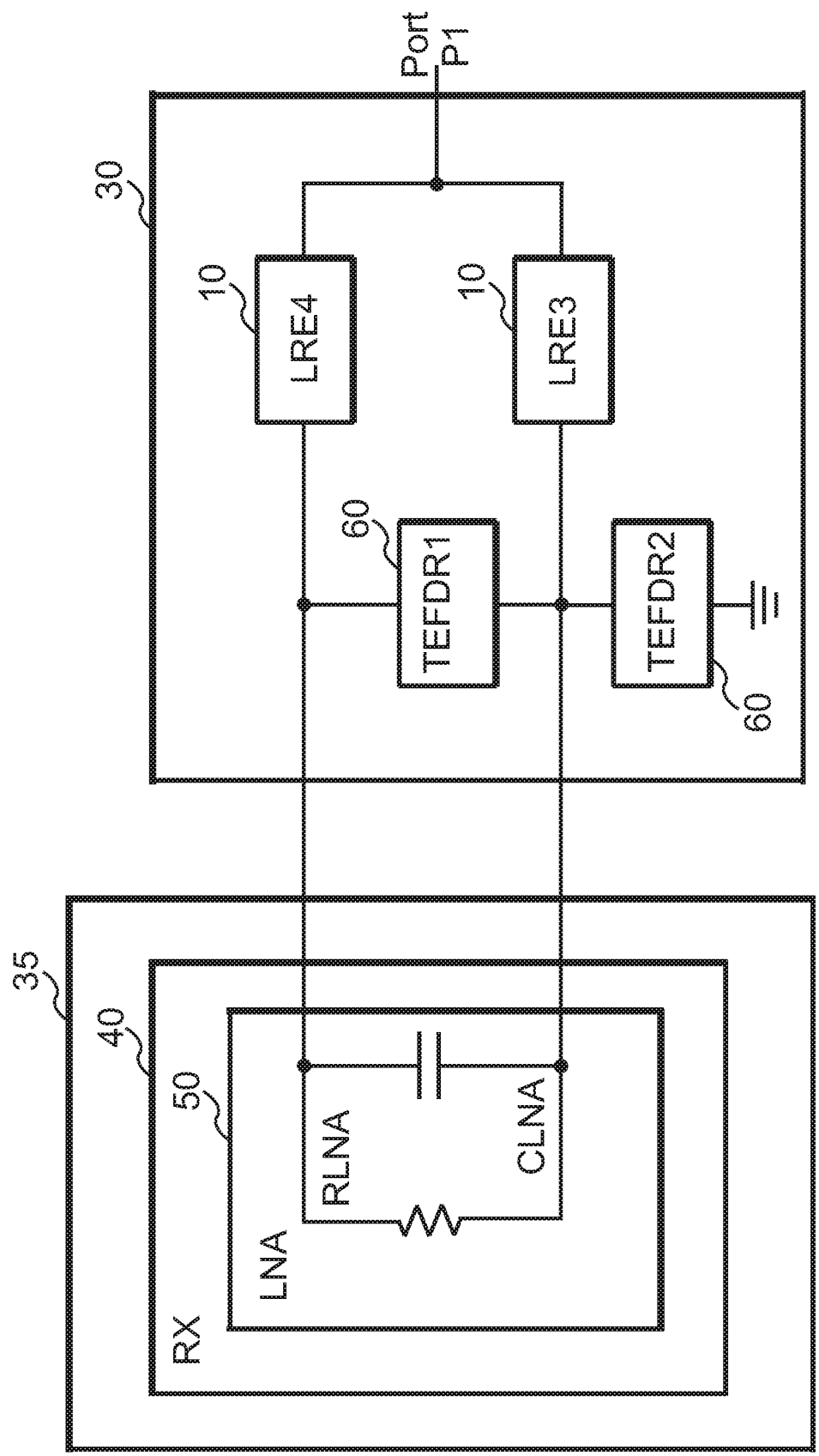
FIG. 15 shows a circuit arrangement for an 8-element multi-band matching balun according to an exemplary embodiment.

FIG. 15 shows a circuit arrangement for an 8-element multi-band matching balun 30 according to an exemplary embodiment. In this embodiment, LRE3 and LRE4 are not replaced with corresponding TEFDRs. The remaining LREs, i.e., LRE1-LRE2 in FIG. 10, are replaced with four corresponding TEFDRs (i.e., TEFDR2-TEFDR4) to realize multi-band matching balun 30 in FIG. 15.

Referring to FIG. 15, multi-band matching balun 30 is coupled to port P1 (e.g., single-ended antenna, filter, etc., with a given impedance, such as 50Ω). Multi-band matching balun 30 is also coupled to RF apparatus 35, more specifically, to the input of RX circuitry 40.

In the embodiment shown, the input of RX circuitry 40 includes LNA 50. The input circuit of LNA 50 is represented by a resistor RLNA (e.g., 750Ω) in parallel with a capacitor CLNA (e.g., 1.1 pF). Thus, multi-band matching balun 30 provides impedance matching between the impedance presented at port P1 and the input impedance of LNA 50.

As noted, 8-element multi-band matching baluns are obtained by replacing two of the four LREs in FIG. 10 with TEFDRs to realize the circuit in FIG. 15. The TEFDRs may be any of the TEFDRs shown in FIGS. 6-9. Depending on the choice of TEFDRs to replace the LREs in FIG. 10, multi-band matching baluns with different and/or desired characteristics (e.g., frequency bands of operation) may be obtained.

Figure 16:
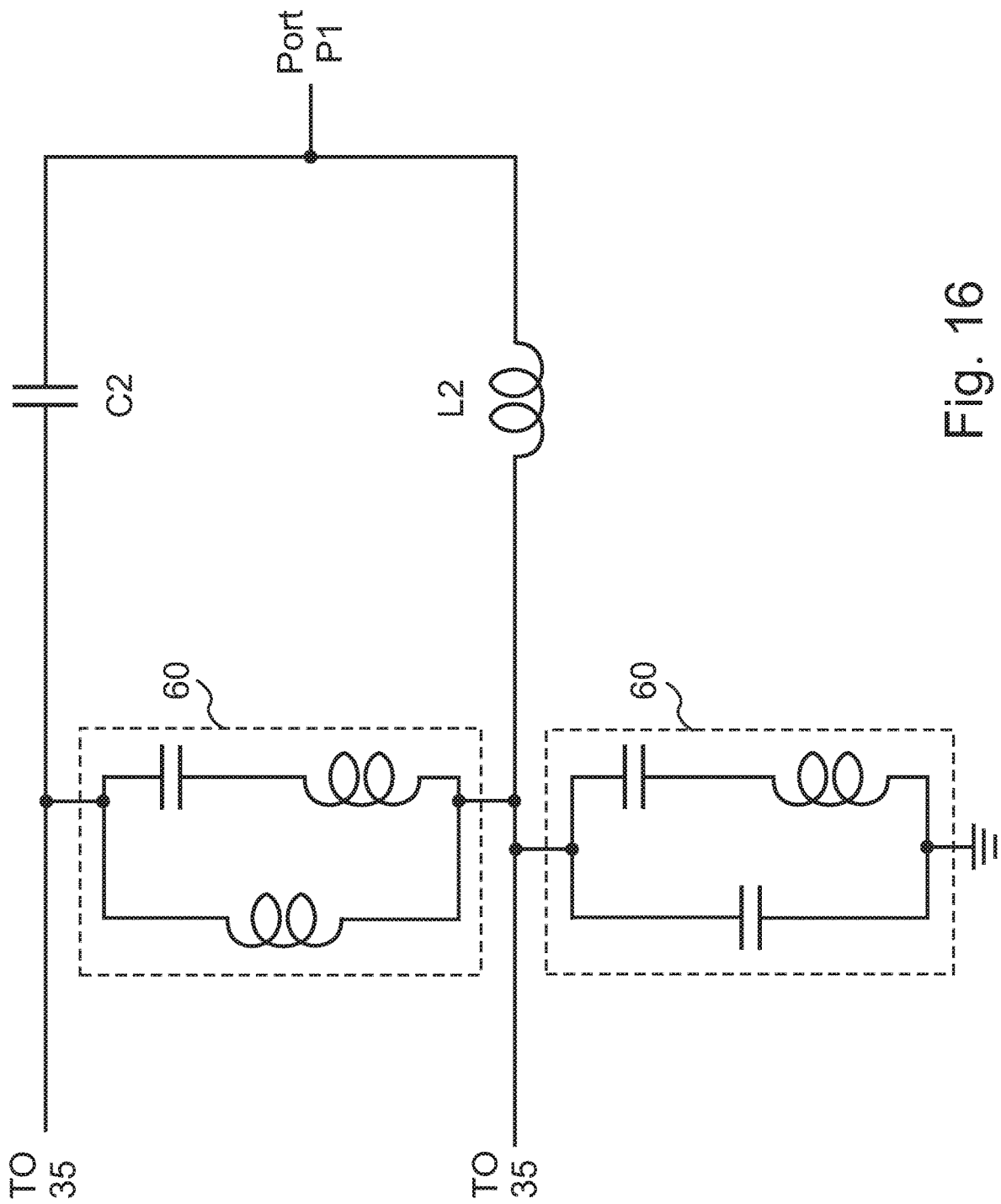
FIG. 16 shows a circuit arrangement for an 8-element multi-band matching balun according to an exemplary embodiment.

As merely one example, FIG. 16 shows a circuit arrangement for an 8-element multi-band matching balun 30 according to an exemplary embodiment. The multi-band matching balun shown in the exemplary embodiment of FIG. 16 is obtained by: (i) replacing LRE1 in FIG. 10 (or inductor L1 in FIG. 1) with TEFDR 60 shown in FIG. 6; (ii) replacing LRE2 in FIG. 10 (or capacitor C1 in FIG. 1) with TEFDR 60 shown in FIG. 8. Note that inductor L2 (LRE3) and C2 (LRE4) have not been replaced with TEFDRs.

Multi-band matching balun 30 in FIG. 16 illustrates merely one example of an 8-element multi-band matching balun, which uses TEFDRs 60 shown in FIGS. 6 and 8, but not TEFDRs 60 shown in FIGS. 7 and 9. Other possibilities and varieties exist and are contemplated for realizing 8-element multi-band matching baluns, as described above with respect to 12-element multi-band matching baluns.

Generally speaking, 8-element multi-band matching baluns may be realized as follows (references are to the reactive components in FIG. 1):

L1 and C1 are kept as single reactive components, and L2 and C2 are replaced with corresponding TEFDRs selected from the embodiments shown in FIGS. 6-9;

L1 and C2 are kept as single reactive components, and L2 and C1 are replaced with corresponding TEFDRs selected from the embodiments shown in FIGS. 6-9;

L1 and L2 are kept as single reactive components, and C1 and C2 are replaced with corresponding TEFDRs selected from the embodiments shown in FIGS. 6-9;

L2 and C1 are kept as single reactive components, and L1 and C2 are replaced with corresponding TEFDRs selected from the embodiments shown in FIGS. 6-9;

L2 and C2 are kept as single reactive components, and L1 and C1 are replaced with corresponding TEFDRs selected from the embodiments shown in FIGS. 6-9; or C1 and C2 are kept as single reactive components, and L1 and L2 are replaced with corresponding TEFDRs selected from the embodiments shown in FIGS. 6-9.

As noted above, the TEFDRs selected to replace the corresponding LREs may be selected from TEFDRs 60 shown in FIGS. 6-9. Depending on the choice of TEFDRs, various multi-band matching balun with different characteristics (e.g., frequency bands of operation) may be obtained.

One aspect of the disclosure relates to 6-element multi-band matching baluns. Six-element multi-band matching baluns are obtained by replacing one of four LREs in FIG. 10 with a corresponding TEFDR. The TEFDR may be any of the TEFDRs shown in FIGS. 6-9. Depending on the choice of TEFDR to replace an LRE in FIG. 10, multi-band matching baluns with different and/or desired characteristics (e.g., frequency bands of operation) may be obtained.

Figure 17:
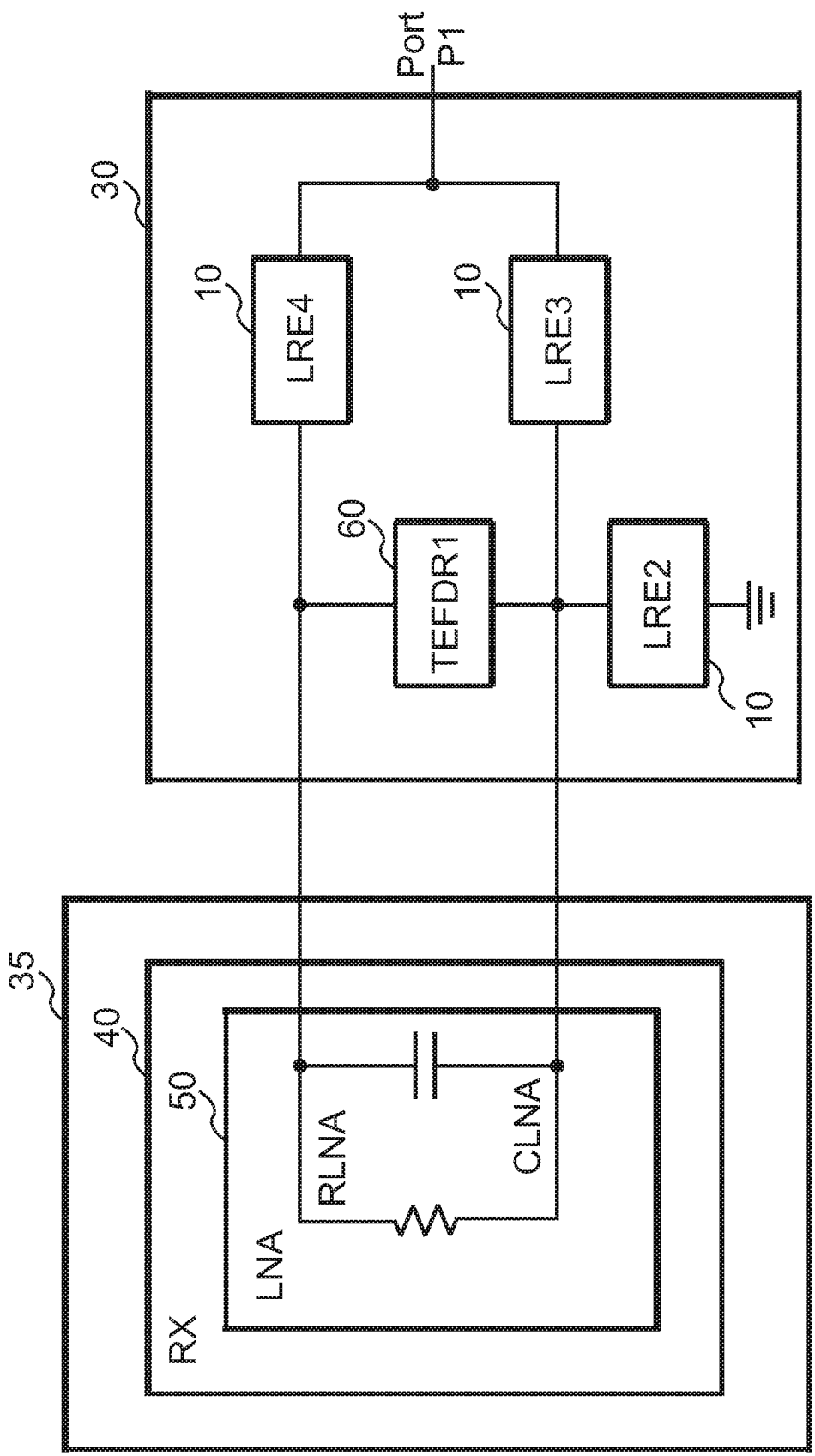
FIG. 17 shows a circuit arrangement for a 6-element multi-band matching balun according to an exemplary embodiment.

FIG. 17 shows a circuit arrangement for a 6-element multi-band matching balun 30 according to an exemplary embodiment. In this embodiment, LRE2, LRE3, and LRE4 are not replaced with corresponding TEFDRs. The remaining LRE, i.e., LRE1 in FIG. 10, is replaced with a corresponding TEFDR1 to realize multi-band matching balun 30 in FIG. 17.

Referring to FIG. 17, multi-band matching balun 30 is coupled to port P1 (e.g., single-ended antenna, filter, etc., with a given impedance, such as 50Ω). Multi-band matching balun 30 is also coupled to RF apparatus 35, more specifically, to the input of RX circuitry 40.

In the embodiment shown, the input of RX circuitry 40 includes LNA 50. The input circuit of LNA 50 is represented by a resistor RLNA (e.g., 750Ω) in parallel with a capacitor CLNA (e.g., 1.1 pF). Thus, multi-band matching balun 30 provides impedance matching between the impedance presented at port P1 and the input impedance of LNA 50.

As noted, 6-element multi-band matching baluns are obtained by replacing one of the four LREs in FIG. 10 with a corresponding TEFDR to realize the circuit in FIG. 17. The TEFDR may be any of the TEFDRs shown in FIGS. 6-9. Depending on the choice of TEFDR to replace the LRE in FIG. 10, multi-band matching baluns with different and/or desired characteristics (e.g., frequency bands of operation) may be obtained.

Figure 18:
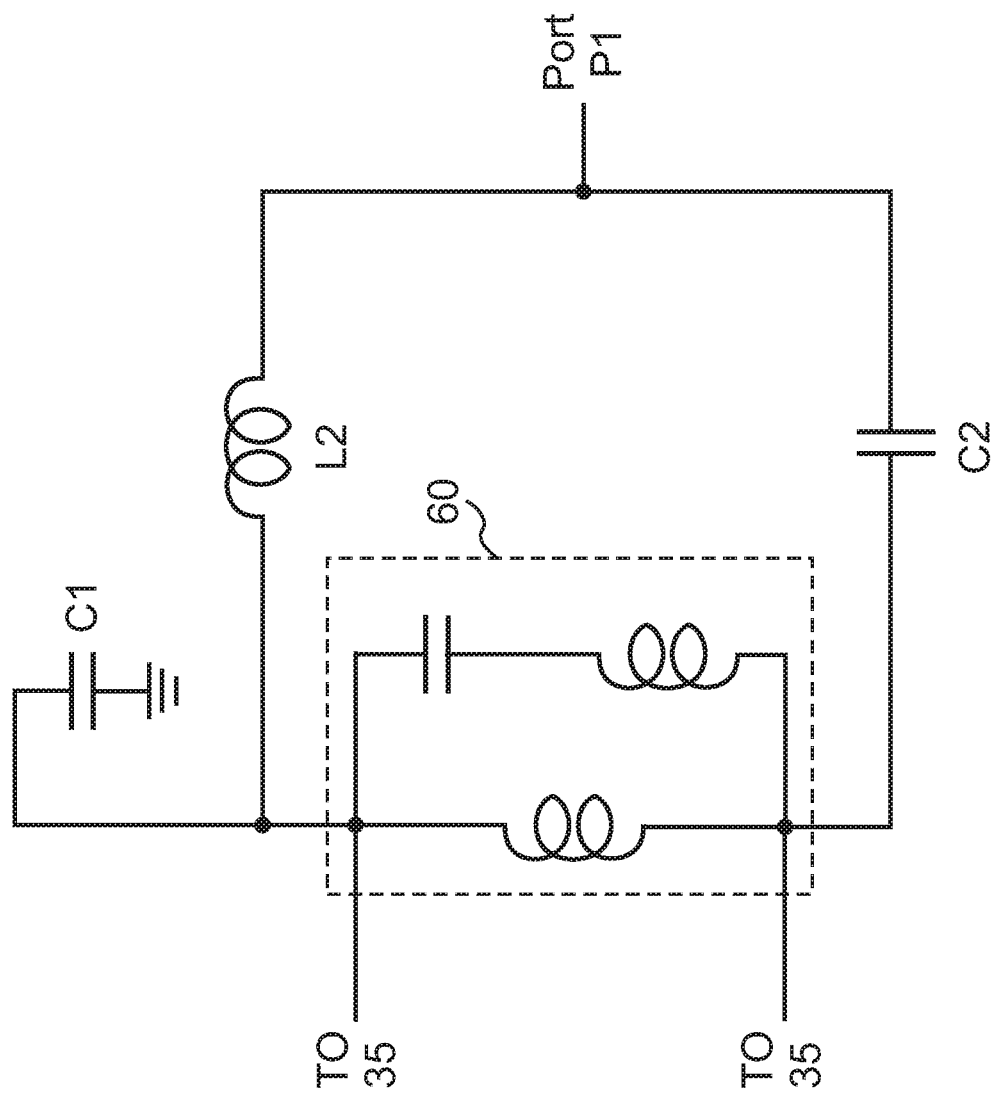
FIG. 18 shows a circuit arrangement for a 6-element multi-band matching balun according to an exemplary embodiment.

As merely one example, FIG. 18 shows a circuit arrangement for a 6-element multi-band matching balun 30 according to an exemplary embodiment. The multi-band matching balun shown in the exemplary embodiment of FIG. 18 is obtained by replacing LRE1 in FIG. 10 (or inductor L1 in FIG. 1) with TEFDR 60 shown in FIG. 6. Note that capacitor C1 (LRE2), inductor L2 (LRE3), and capacitor C2 (LRE4) have not been replaced with TEFDRs.

Multi-band matching balun 30 in FIG. 18 illustrates merely one example of a 6-element multi-band matching balun, which uses TEFDRs 60 shown in FIG. 6, but not TEFDRs 60 shown in FIGS. 7, 8, and 9. Other possibilities and varieties exist and are contemplated for realizing 6-element multi-band matching baluns, as described above with respect to 12-element multi-band matching baluns.

Generally speaking, 6-element multi-band matching baluns may be realized as follows (references are to the reactive components in FIG. 1):

L1, L2, and C1 are kept as single reactive components, and C2 is replaced with a corresponding TEFDR selected from the embodiments shown in FIGS. 8-9;

L1, L2, and C2 are kept as single reactive components, and C1 is replaced with a corresponding TEFDR selected from the embodiments shown in FIGS. 8-9;

L1, C2, and C1 are kept as single reactive components, and L2 is replaced with a corresponding TEFDR selected from the embodiments shown in FIGS. 6-7; or L2, C2, and C1 are kept as single reactive components, and L1 is replaced with a corresponding TEFDR selected from the embodiments shown in FIGS. 6-7.

As noted above, the TEFDR selected to replace the corresponding LRE may be selected from TEFDRs 60 shown in FIGS. 6-9. Depending on the choice of TEFDR, various multi-band matching balun with different characteristics (e.g., frequency bands of operation) may be obtained.

Figure 19:
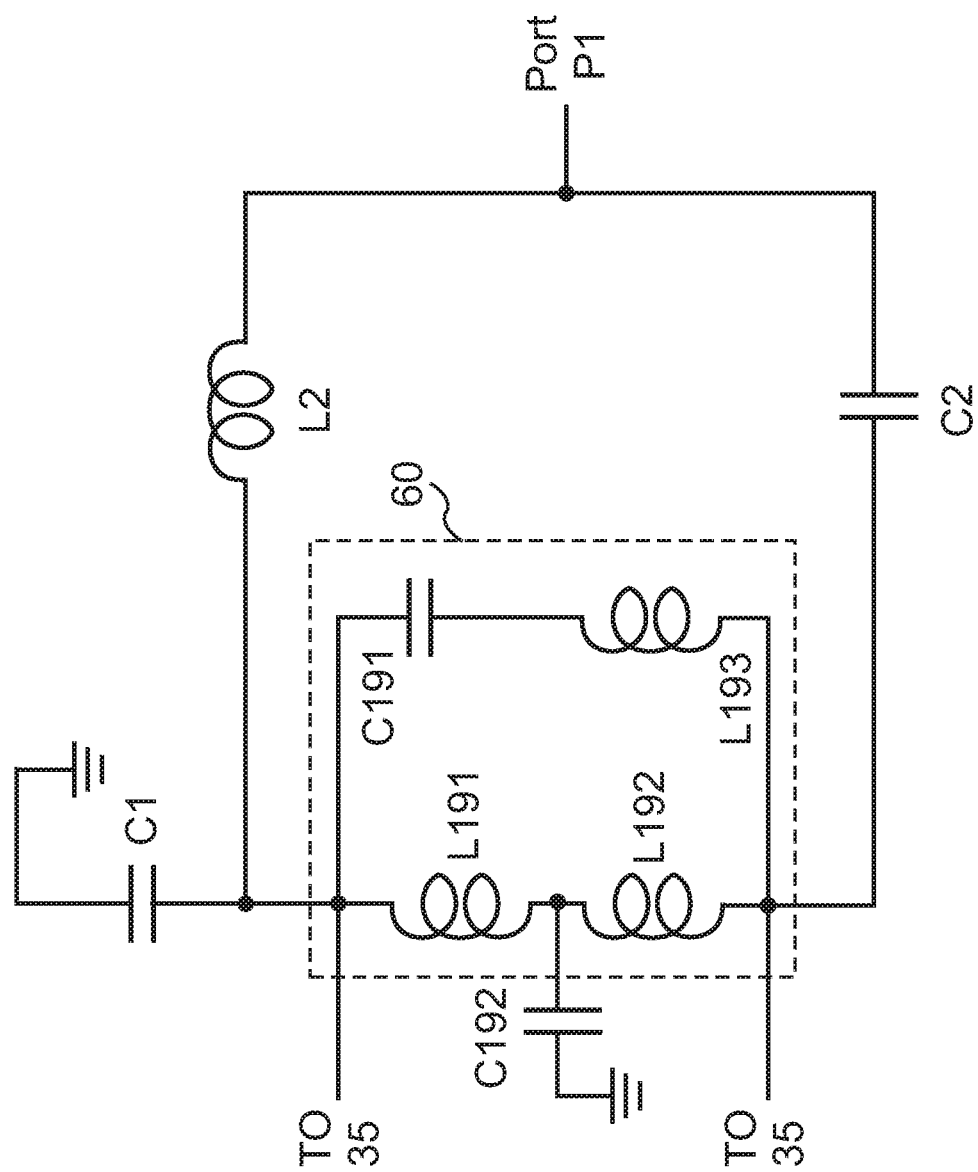
FIG. 19 shows a circuit arrangement for a multi-band matching balun with a harmonic trap according to an exemplary embodiment.

One aspect of the disclosure relates to harmonic traps, specifically, harmonic traps added to multi-band matching baluns. FIG. 19 shows a circuit arrangement for a multi-band matching balun 30 with a harmonic trap according to an exemplary embodiment. The multi-band matching balun is obtained by replacing LRE1 in FIG. 10 (or inductor L1 in FIG. 1) with TEFDR 60 (in this example, using TEFDR 60 shown in FIG. 6).

Referring again to FIG. 19, capacitor 192 is also coupled between an internal node of TEFDR 60 and circuit ground. The internal node of TEFDR 60 is a node obtained by breaking a single inductor in TEFDR 60 into two series-coupled inductors, i.e., inductor L191 and inductor L192 (typically, inductors L191 and L192 have the same inductance). TEFDR 60 also includes inductor L193 and capacitor C191.

Breaking or dividing the single inductor in TEFDR 60 into inductor L191 and L192 allows obtaining a symmetric point. The symmetric point serves as virtual ground reference for the TEFDR load.

The combination L191-C192 and the combination L192-C192 have equal tuned resonances at the second-harmonic of the middle frequency of the higher frequency band of operation of the multi-band matching balun. As a result, the common-mode 2nd-harmonic signals is shunted to circuit ground. Consequently, common-mode suppression of multi-band matching balun and, therefore, the fundamental operation in the higher band of frequency for the multi-band matching balun is improved.

Referring to the figures, persons of ordinary skill in the art will note that the various blocks shown might depict mainly the conceptual functions and signal flow. The actual circuit implementation might or might not contain separately identifiable hardware for the various functional blocks and might or might not use the particular circuitry shown. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation. Other modifications and alternative embodiments in addition to the embodiments in the disclosure will be apparent to persons of ordinary skill in the art. Accordingly, the disclosure teaches those skilled in the art the manner of carrying out the disclosed concepts according to exemplary embodiments, and is to be construed as illustrative only. Where applicable, the figures might or might not be drawn to scale, as persons of ordinary skill in the art will understand.

The particular forms and embodiments shown and described constitute merely exemplary embodiments. Persons skilled in the art may make various changes in the shape, size and arrangement of parts without departing from the scope of the disclosure. For example, persons skilled in the art may substitute equivalent elements for the elements illustrated and described. Moreover, persons skilled in the art may use certain features of the disclosed concepts independently of the use of other features, without departing from the scope of the disclosure.

The invention claimed is:

1. An apparatus, comprising:
a radio-frequency (RF) apparatus; and
a multi-band matching balun using passive components, the multi-band matching balun coupled to the RF apparatus, the multi-band matching balun including at least one three-element frequency-dependent resonator (TEFDR) and at most three reactive elements, wherein the at least one TEFDR provides functionality of an inductor having a frequency-dependent inductance or a capacitor having a capacitance having a frequency-dependent capacitance.

2. The apparatus according to claim 1, wherein the RF apparatus comprises receive circuitry or transmit circuitry.

3. The apparatus according to claim 1, wherein the RF apparatus comprises both receive circuitry and transmit circuitry.

4. The apparatus according to claim 1, wherein the at least one three-element frequency-dependent resonator comprises: (a) two inductors coupled to one capacitor; or (b) one inductor coupled to two capacitors.

5. The apparatus according to claim 1, wherein the at most three reactive elements comprise at least one capacitor or at least one inductor.

6. The apparatus according to claim 1, wherein the at least one three-element frequency-dependent resonator realizes an inductor having an inductance that varies as a function of frequency.

7. The apparatus according to claim 1, wherein the at least one three-element frequency-dependent resonator realizes a capacitor having a capacitance that varies as a function of frequency.

8. The apparatus according to claim 1, wherein the three-element frequency-dependent resonator provides impedance matching between the RF apparatus and either a filter or an antenna.

9. The apparatus according to claim 1, wherein the three-element frequency-dependent resonator provides balun functionality between the RF apparatus and either a filter or an antenna.

10. An apparatus, comprising:
a radio-frequency (RF) apparatus; and
a multi-band matching balun coupled to the RF apparatus, the multi-band matching balun comprising at least one three-element frequency-dependent resonator (TEFDR) and at most three lumped reactive elements (LREs),
wherein neither the at least one three-element frequency-dependent resonator nor the at most three lumped reactive elements comprises variable or tunable capacitors or inductors, and
wherein the at least one TEFDR provides functionality of an inductor having a frequency-dependent inductance or a capacitor having a capacitance having a frequency-dependent capacitance.

11. The apparatus according to claim 10, wherein three-element frequency-dependent resonator realizes an inductor having an inductance that varies as a function of frequency.

12. The apparatus according to claim 10, wherein the three-element frequency-dependent resonator realizes a capacitor having a capacitance that varies as a function of frequency.

13. The apparatus according to claim 10, wherein the three-element frequency-dependent resonator comprises either: (a) two capacitor and an inductor, or (b) two inductors and a capacitor.

14. The apparatus according to claim 10, wherein the multi-band matching balun further comprises a capacitor coupled to the at least one three-element frequency-dependent resonator to realize a second-harmonic trap.

15. A method of operating an apparatus that includes a radio-frequency (RF) apparatus, the method comprising using a multi-band matching balun using passive components, the multi-band matching balun coupled to the RF apparatus to provide impedance matching and balun functionality, wherein the multi-band matching balun includes at least one three-element frequency-dependent resonator (TEFDR) and at most three reactive elements, wherein the at least one TEFDR provides functionality of an inductor having a frequency-dependent inductance or a capacitor having a capacitance having a frequency-dependent capacitance.

16. The method according to claim 15, wherein the three-element frequency-dependent resonator realizes an inductor having an inductance that varies as a function of frequency.

17. The method according to claim 16, wherein the three-element frequency-dependent resonator realizes a capacitor having a capacitance that varies as a function of frequency.

18. The method according to claim 15, wherein the three-element frequency-dependent resonator provides impedance matching between the RF apparatus and either a filter or an antenna.

19. The method according to claim 15, wherein the three-element frequency-dependent resonator provides balun functionality between the RF apparatus and either a filter or an antenna.

20. The method according to claim 15, wherein the at least one three-element frequency-dependent resonator comprises: (a) two inductors coupled to one capacitor; or (b) one inductor coupled to two capacitors.

\* \* \* \* \*